United States Patent [19]

Iwahashi et al.

[11] 4,365,316

[45] Dec. 21, 1982

[54] MULTIFUNCTION TERMINAL CIRCUIT

[75] Inventors: Hiroshi Iwahashi, Yokohama; Masamichi Asano, Musashino, both of Japan

[73] Assignee: Tokyo Shibaura Denki Kabushiki Kaisha, Japan

[21] Appl. No.: 124,772

[22] Filed: Feb. 26, 1980

[30] Foreign Application Priority Data

Feb. 28, 1979 [JP] Japan .................................. 54-23204

[51] Int. Cl.³ .................... G11C 11/40; G11C 7/00
[52] U.S. Cl. ..................................... 365/72; 307/448; 365/229
[58] Field of Search ............... 307/125, 577, 584, 448; 365/63, 72, 191, 227, 229

[56] References Cited

U.S. PATENT DOCUMENTS

| | | | |
|---|---|---|---|
| 3,832,574 | 8/1974 | Leehan | 307/448 |
| 4,148,099 | 4/1979 | Lauffer et al. | 365/229 |
| 4,159,541 | 6/1979 | Ward et al. | 365/191 |
| 4,179,628 | 12/1979 | Ohgishi et al. | 307/448 |
| 4,227,257 | 10/1980 | Sato | 365/229 |

FOREIGN PATENT DOCUMENTS 50-114037  4/1975  Japan .

OTHER PUBLICATIONS

Green et al, "E-PROM Doubles Bit Density Without Adding a Pin", *Electronics*, 8/16/79, pp. 126–129.
Intel, 2732, 32K (4K×8) UV Erasable PROM, 10/78.

*Primary Examiner*—Stuart N. Hecker
*Attorney, Agent, or Firm*—Finnegan, Henderson, Farabow, Garrett & Dunner

[57] ABSTRACT

A multifunction terminal circuit having an optional circuit (12) a signal terminal (10) connected to the optional circuit; an unidirectional conductor means (14) connected to the signal terminal; and a circuit means (16) whose coupling node (A) is coupled with the signal terminal through the unidirectional conductor means.

The circuit means determines a conduction state of the unidirectional conductor means in accordance with a potential difference between the signal terminal and the coupling node.

13 Claims, 80 Drawing Figures

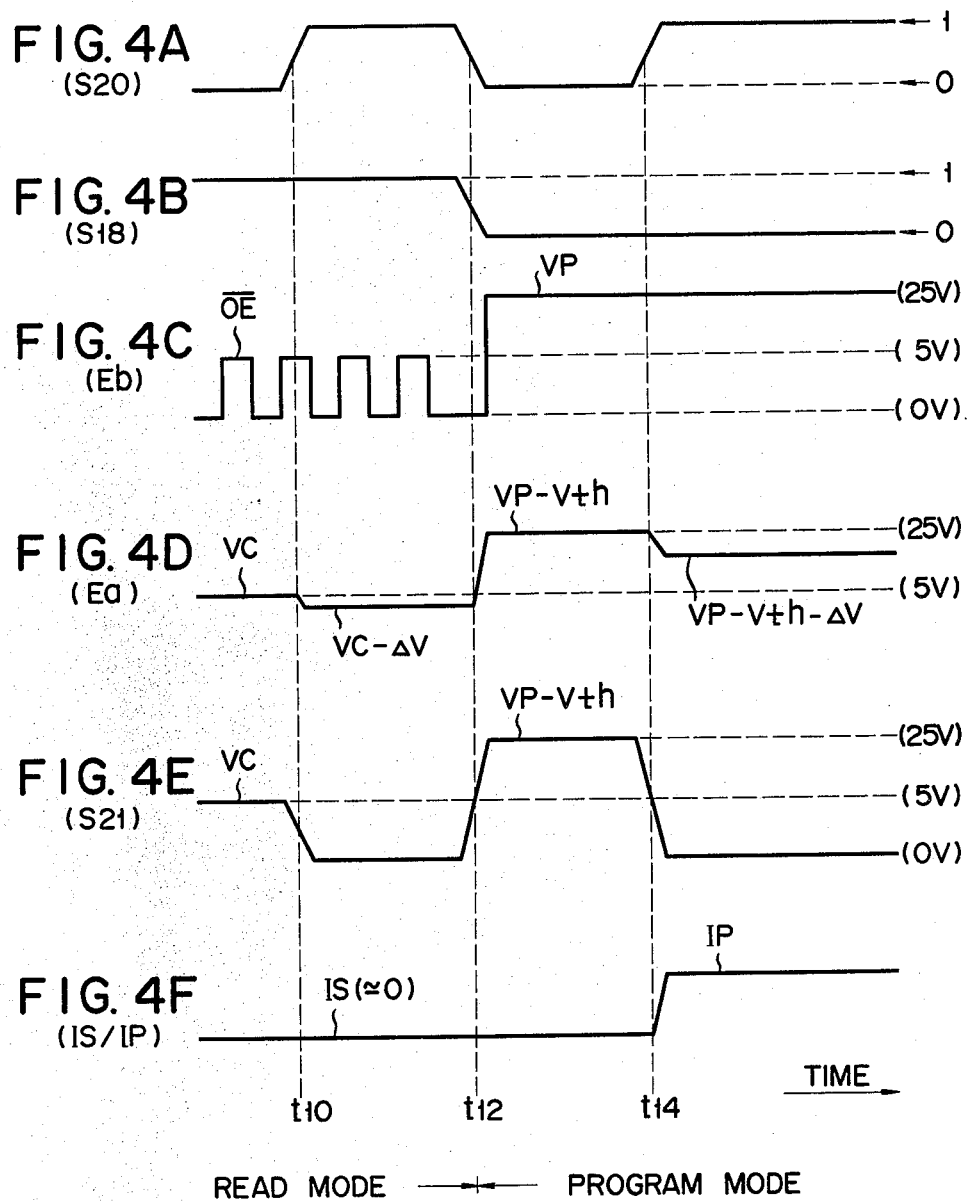

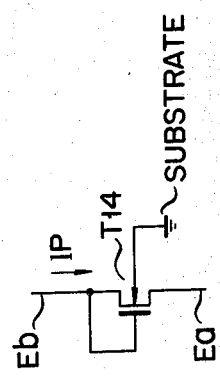
FIG. 5A
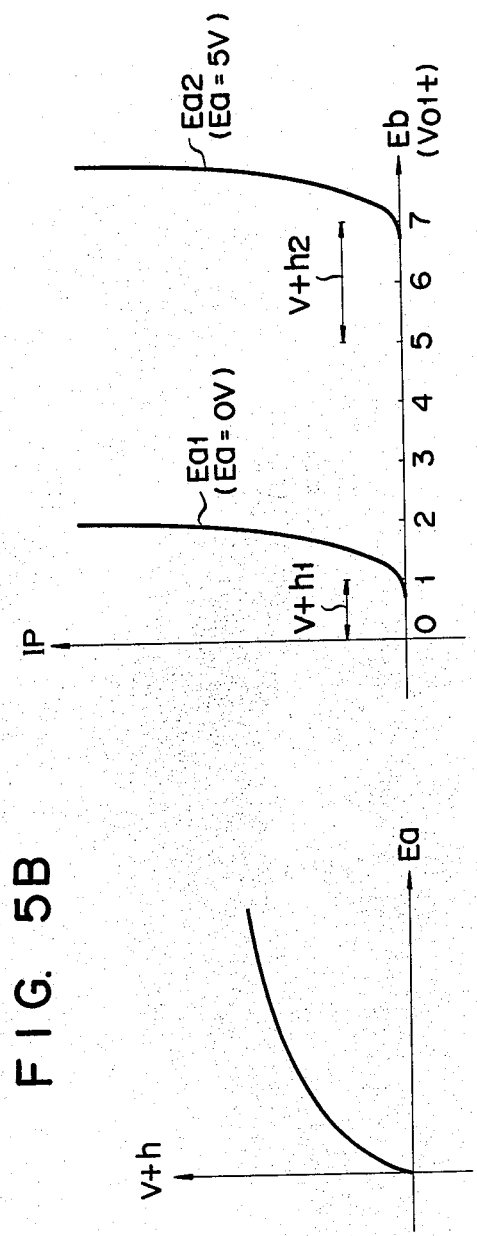
FIG. 5B
FIG. 5C

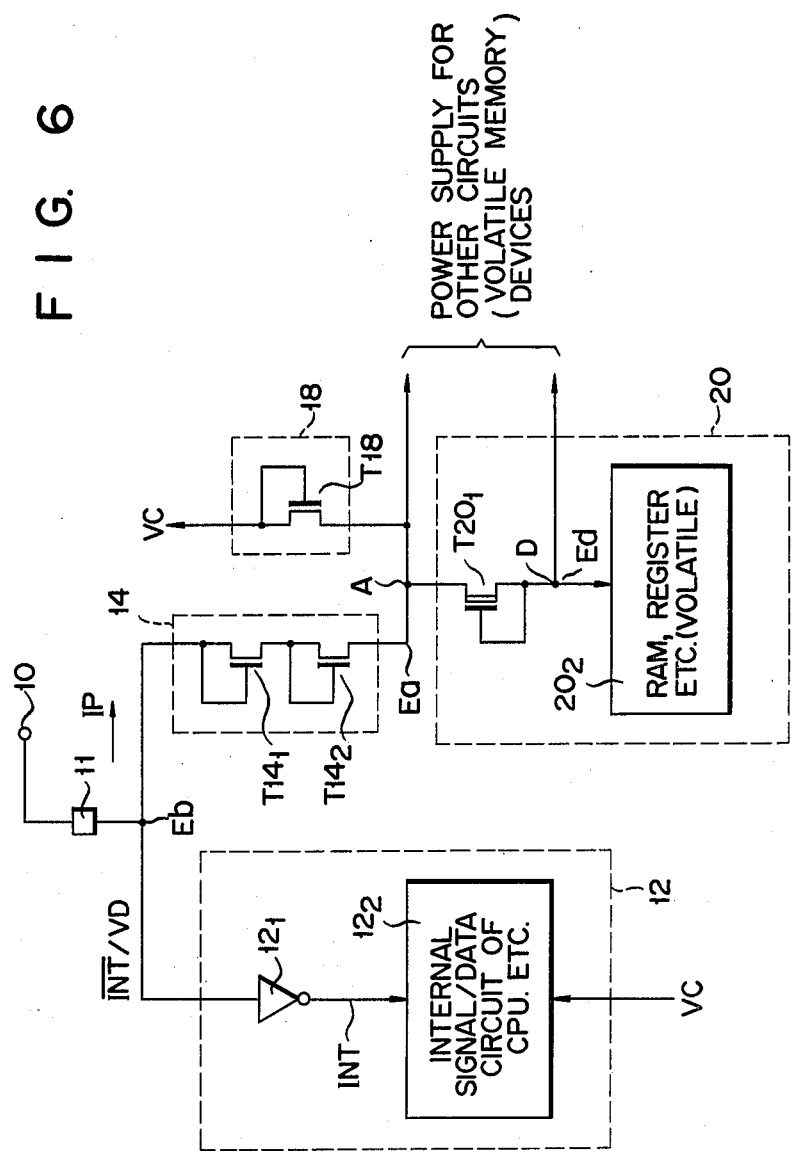

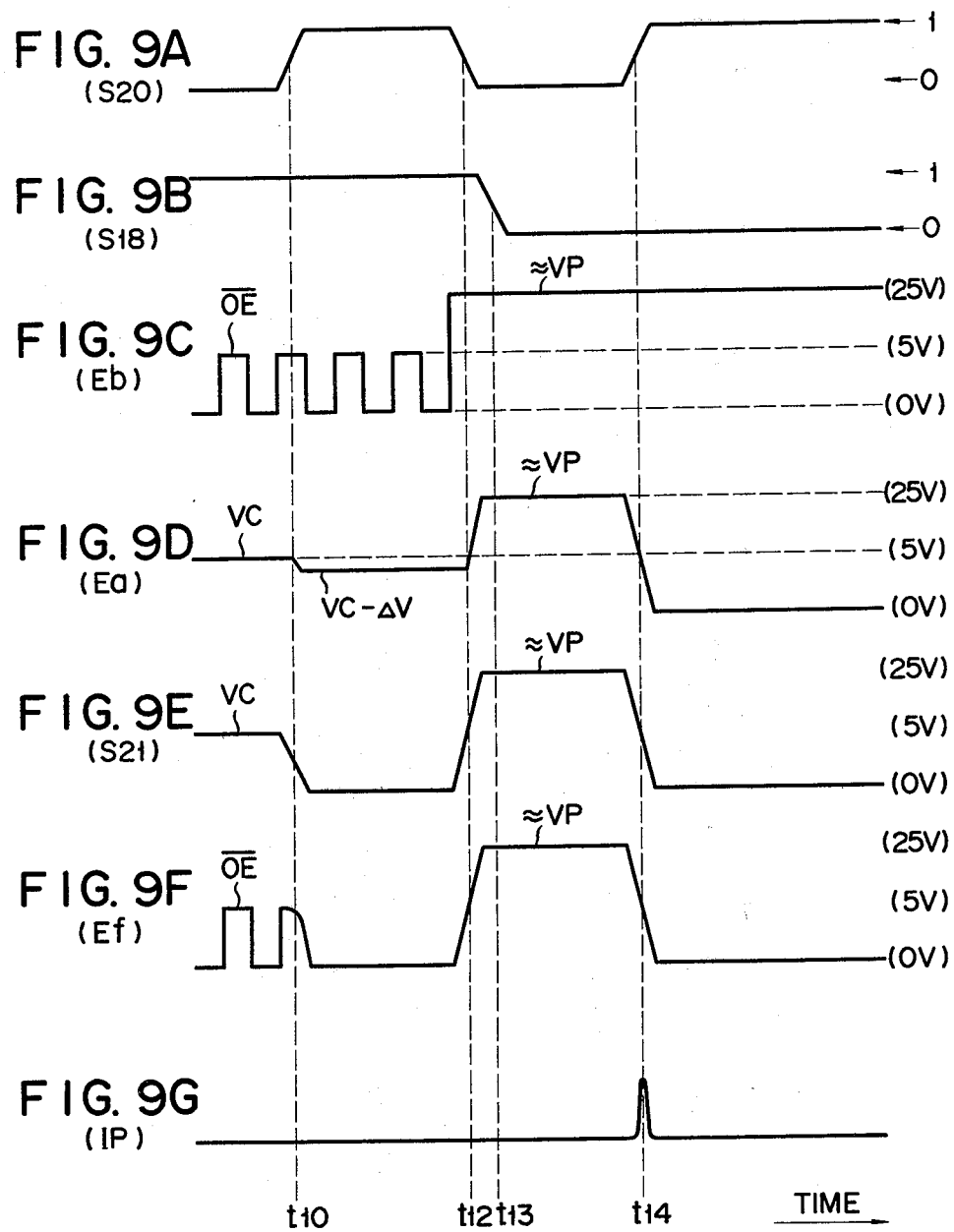

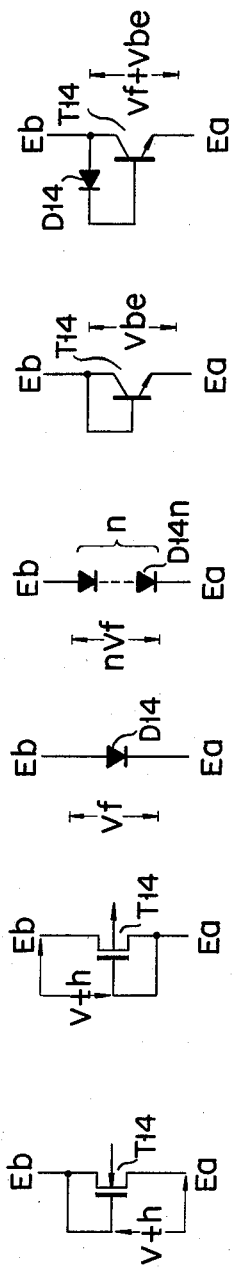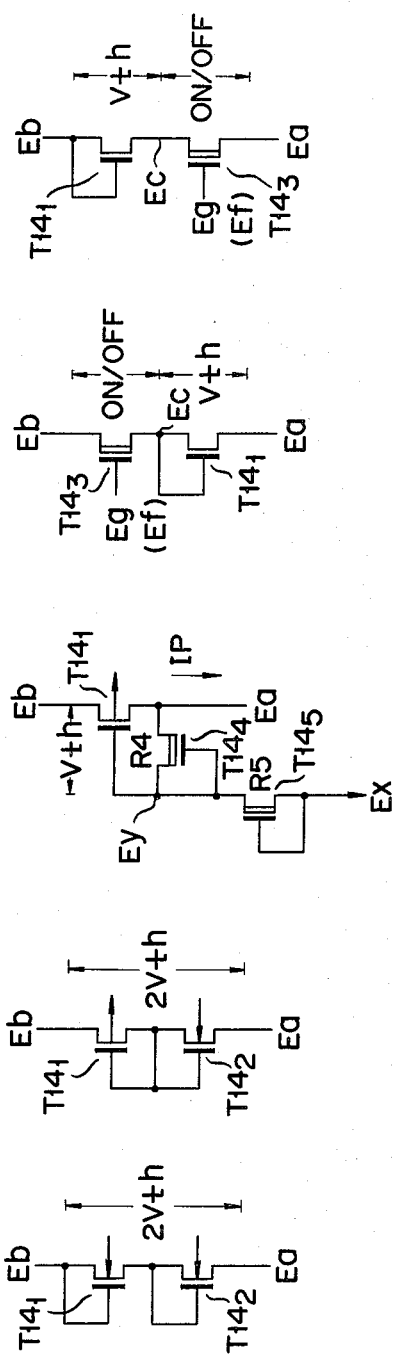

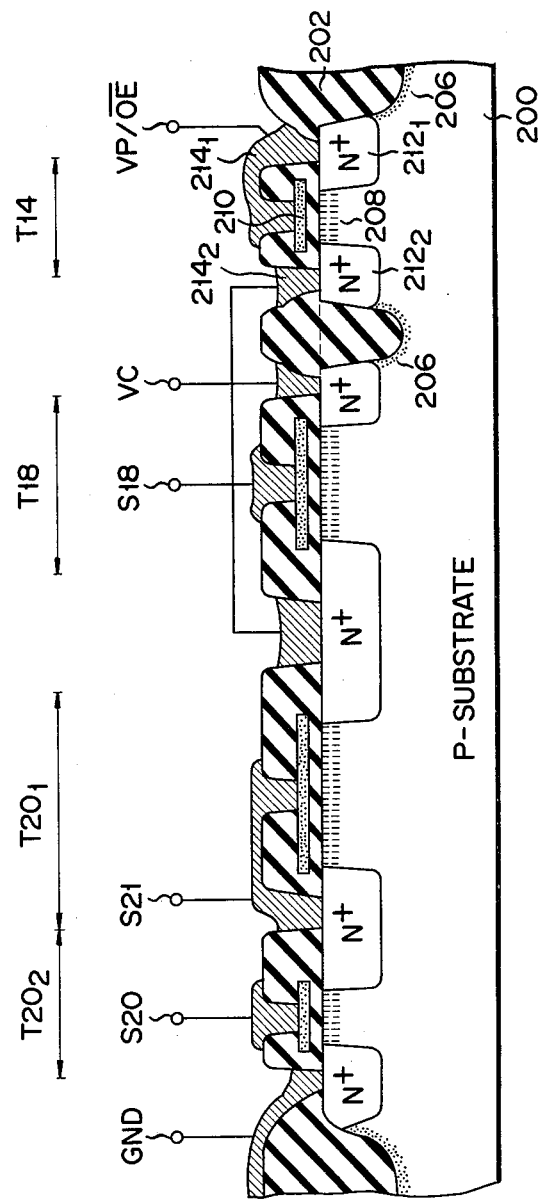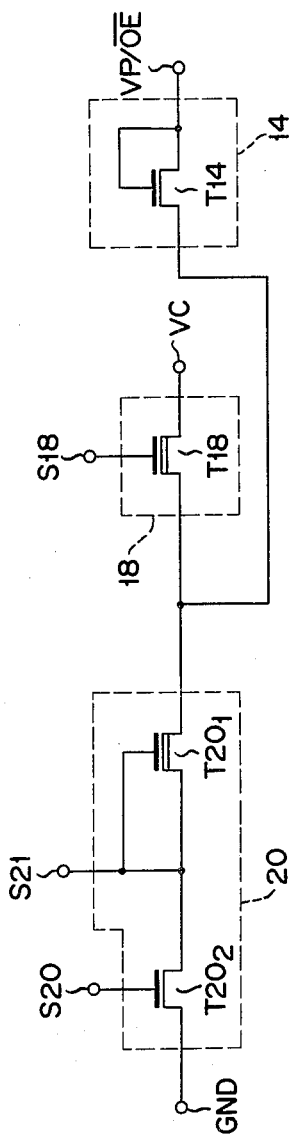
FIG. 19A
FIG. 19B

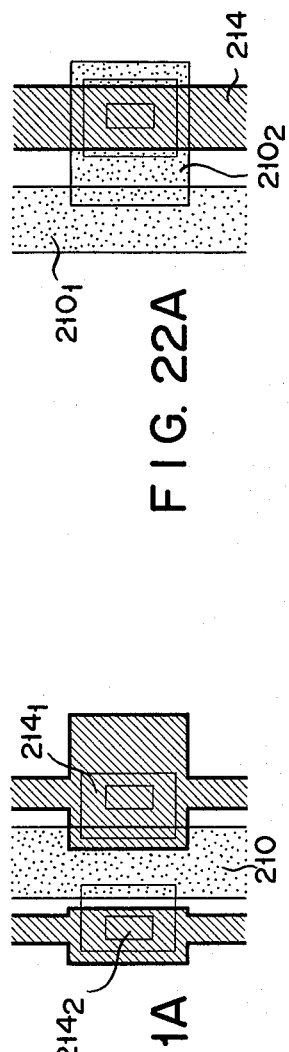
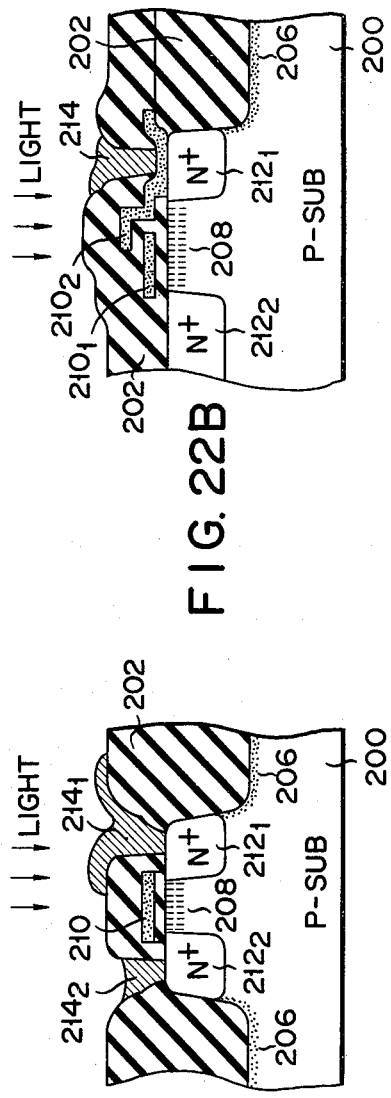
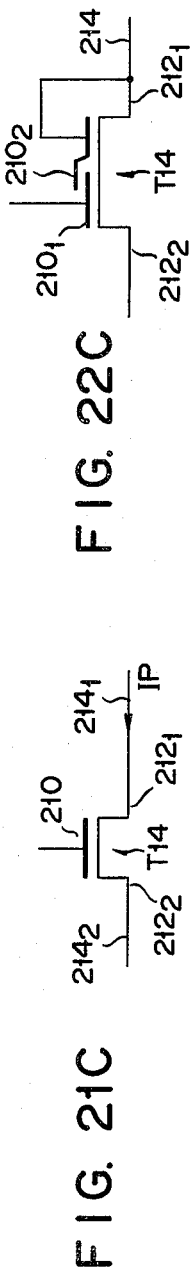

MULTIFUNCTION TERMINAL CIRCUIT

BACKGROUND OF THE INVENTION

The present invention relates to a multifunction terminal circuit for using a single terminal for a plurality of uses and, more particularly, to the multifunction terminal circuit which is useful to reduce the number of external terminals of an IC package.

Generally, the IC package of the dual in-line type has mounting standards set up in accordance with the number of the external terminals (external pins). Accordingly, a printed circuit board designed for 24 pins, for example, accepts the mounting thereon of a 24-pin type IC made by any maker. The number of pins of dual in-line ICs are usually 16, 24 and 40, for example. The IC package is larger in size as the number of pins thereof is larger. As a result, the price of each IC rises and it is difficult to make small a circuit block using such ICs. Therefore, it is more desirable to employ a 24-pin type IC package than that of a 26-pin type IC package.

Conversely, when the number of pins used is limited, it is desirable to use the external pins as effectively as possible, in order to bring about many functions of the IC package used. The effective use of the external pins is effected by using a proper code conversion and a matrix in an IC memory, for example. In the case of an IC memory model TMM-121C manufactured by Toshiba Corporation in which the inventors serve, the memory contents of 512 words are specified by five row data and four column data. In other words, 512 words are selected by using only 9 pins. In fact, there is a case where, although the external pins are most effectively used by such a circuit technique, the number of the pins must be increased for some function requirements. In such a case, the IC package of 26 pins or more must be used in place of the 24-pin package. However, the increase of the number of pins is unacceptable. Therefore it is desirable to form a new type IC device with an expanded function and a compatibility with the same type IC device previously developed. Even in such a case where no compatibility with the old device must be taken into account, reduction of the number of external pins while retaining satisfactory number of functions is very important for making the size of the IC small and the cost of it low.

SUMMARY OF THE INVENTION

Accordingly, an object of the invention is to provide a multifunction terminal circuit in which a single terminal can relay a plurality of signals.

To achieve the above object, there is provided a multifunction terminal circuit comprising an optional circuit, a signal terminal connected to the optional circuit, an unidirectional conductor means connected to the signal terminal, and a circuit means whose coupling node is coupled with the signal terminal through the unidirectional conductor means, for setting a conduction state of the unidirectional conductor means in accordance with a potential difference between the signal terminal and the coupling mode.

A multifunction terminal circuit with such a construction allows the signal terminal to be used as a signal terminal for the optional circuit, and the circuit means (or other circuits connecting to the circuit means). More specifically, when the unidirectional conductor means is conductive, the terminal may be used as a signal terminal or a power source terminal for the circuit means. When the unidirectional conductor means is non-conductive, the signal terminal is used as a signal terminal for the optional circuit. If a plurality of such multifunction terminal circuits are collected and the signal terminals of those terminal circuits are collected together to be treated as a single terminal, the single terminal can handle two or more different signals.

Other objects and features of the invention will be apparent from the following description taken in connection with the accompanying drawings, in which:

BRIEF DESCRIPTION OF THE DRAWINGS

FIGS. 4A to 4F are timing charts for illustrating the operation of the FIG. 3 circuit;

FIGS. 5A to 5C illustrate how the gate threshold voltage Vth of a MOS transistor changes with respect to a source potential Ea relative to a substrate;

FIG. 6 is a circuit diagram of another example of the detail of the block diagram shown in FIG. 1;

FIGS. 9A to 9G are timing charts for illustrating the operation of the FIG. 8 circuit;

FIG. 19A is an IC cross sectional view of the FIG. 3 circuit formed by a process illustrated in FIGS. 18A to 18E;

FIG. 19B is an equivalent circuit of the structure of FIG. 19A;

FIGS. 21A to 21B show a screening structure for screening the P-N junction of the MOS transistor T14 part 20 shown in FIG. 19A from the rays of light incident thereupon;

FIG. 21C is an equivalent circuit of the structures shown in FIGS. 21A to 21B;

FIGS. 22A to 22B are a modification of the screening structure shown in FIGS. 21A to 22B;

FIG. 22C is an equivalent circuit of the structure shown in FIGS. 22A and 22B.

DETAILED DESCRIPTION OF THE PREFERRED EMBODIMENTS

Embodiments of a multifunction terminal circuit according to the invention will be described in detail referring to the accompanying drawings. Throughout the drawings, like or equivalent portions will be designated by like reference symbols.

Figure 1:
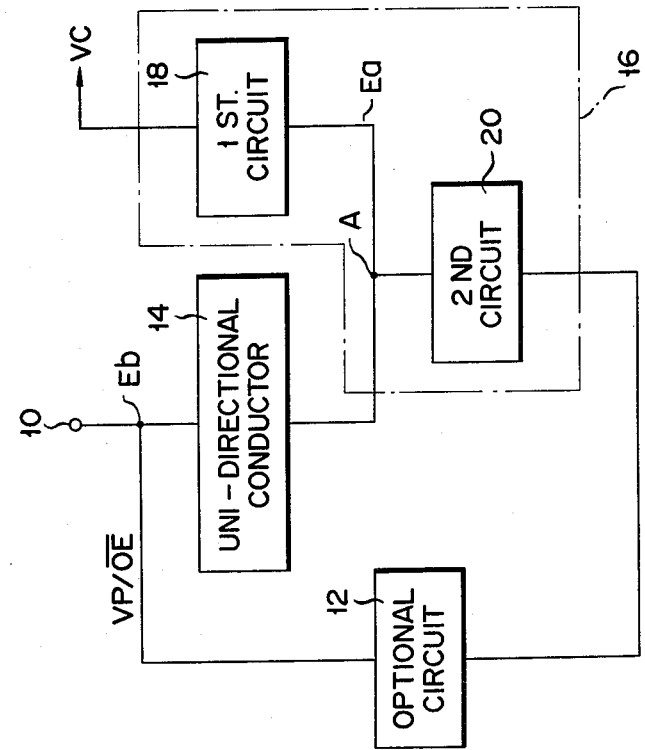
FIG. 1 shows a block diagram of a basic construction of a terminal circuit according to the invention.

FIG. 1 shows a block diagram of a basic construction of the invention which is directed to the multifunction terminal circuit. In the figure, a signal terminal 10 is connected to an optional circuit 12 including an erasable and electrically programmable read-only memory (EPROM). The terminal 10 is connected to a coupling node A of a circuit block 16, through an unidirectional conductor 14. The circuit block 16 includes a first circuit 18 and a second circuit 20. The coupling node A is connected to the second circuit 20 and is coupled with a first potential VC by way of the first circuit 18.

Assume now that the potential at the coupling node A is Ea and the potential at the signal terminal 10 is Eb, and that a signal applied to the terminal 10 is VP or $\overline{OE}$. When Ea≧Eb (=$\overline{OE}$), the conductor 14 is in nonconductive state. (The maximum potential of the signal $\overline{OE}$ is normally VC+about 1 V.) In the nonconductive state of the conductor 14, the circuit block 16 is electrically disconnected from the terminal 10, so that only the optional circuit 12 is connected to the terminal 10. In other words, the terminal 10 is used as an $\overline{OE}$ signal input terminal of the circuit 12. At this time, if the first circuit 18 is conductive, the second circuit 20 is rendered conductive by the potential Ea~VC. Accordingly, the circuit 20 is operable independently of the signal $\overline{OE}$.

When Ea<Eb (=VP), the conductor 14 is in conductive state. In this state of the conductor 14, the circuit block 16 is connected to the terminal 10, so that a given potential corresponding to the VP appears at the coupling node A. At this time, if the first circuit 18 is in an inactive state, the second circuit 20 is rendered conductive by the given potential. Thus, under this condition, the terminal 10 is used as a VP signal input terminal of the circuit block 16 or the second circuit 20. In this case, the optional circuit 12 need not always respond to the signal VP. The circuit 12 may optionally be designed so that it responds to the signal VP or does not so respond.

Let it be emphatically said that the unidirectional conductor 14 allows a signal to pass unidirectionally in a static sense and not in a dynamic sense. Let us consider now a case that current of 100 μA flows from the terminal 10 to the node A. When the current increases from 100 μA to 200 μA without changing the current direction, the change of the current directs from the terminal 10 to the node A. On the other hand, when the currents decreases from 100 μA to 50 μA, the current change directs from the node A to the terminal 10. Thus, when a change of direction of the current flowing through the conductor 14 is taken into account, or when a dynamic signal is handled, the conductor 14 may be bidirectional. It will be understood accordingly that the term "unidirectional" is used in this specification and its appended claims, in the sense of the static operation of the circuit, and also that unidirectional does not mean no passage of a dynamic signal through the conductor 14.

Figure 2:
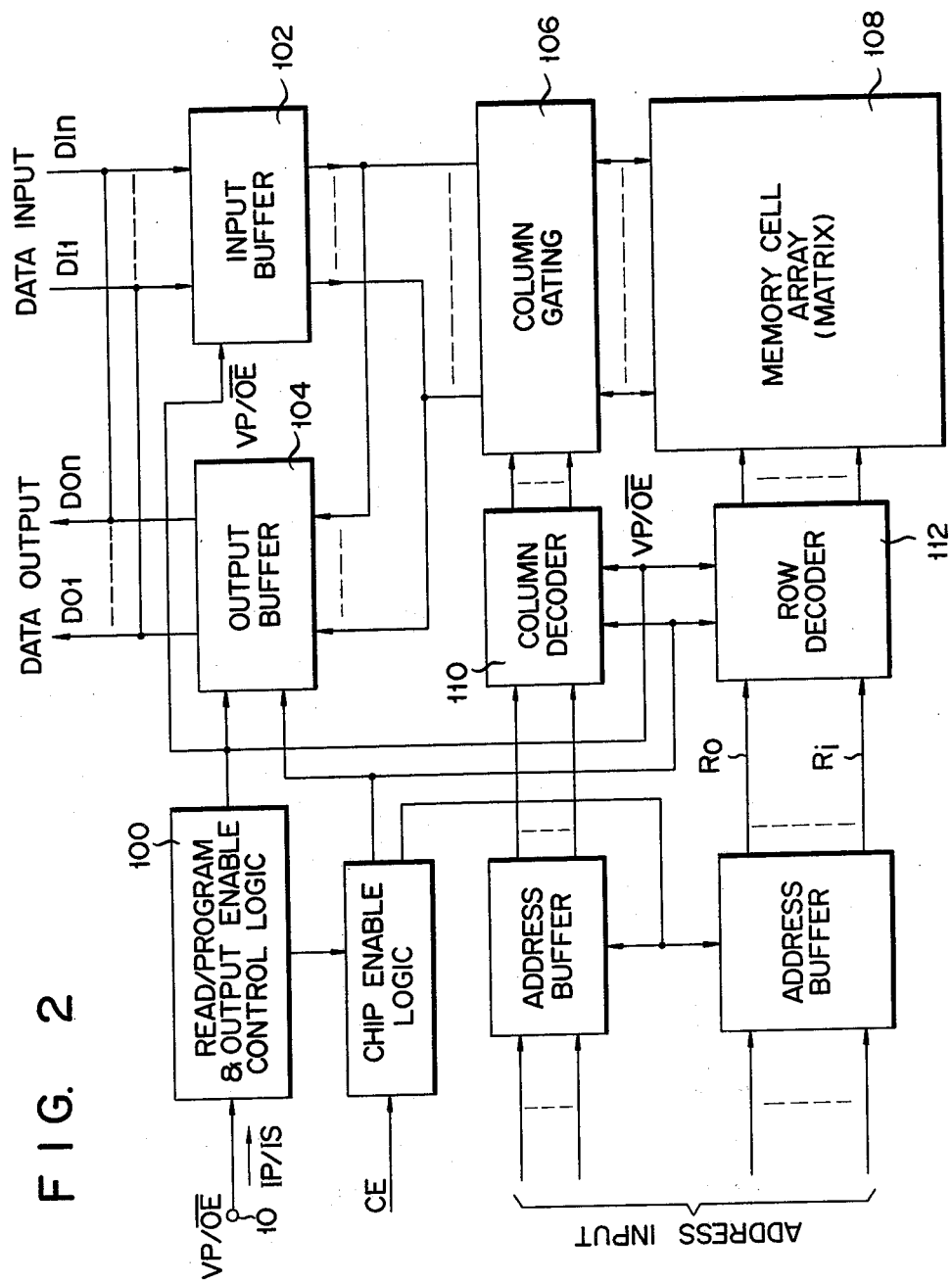
FIG. 2 is a block diagram of an EPROM to which the terminal circuit shown in FIG. 1 is applied.

FIG. 2 shows a block diagram of a circuit construction of an EPROM which is adaptable for the terminal circuit shown in FIG. 1. The circuit construction of the EPROM is of the conventional type and accordingly, no explanation of the respective circuit blocks will be given. For understanding the invention, it is sufficient that one knows what part of the overall circuit of the EPROM includes the terminal circuit according to the invention when the invention is applied to the EPROM.

The terminal circuit may, for example, be included in a read/program & output enable control logic 100 or an input buffer 102. To write data into the EPROM, a program signal VP is loaded into the terminal 10. After this, binary data corresponding to the data input is written into an address of the memory cell array specified by an address input. The signal VP used for the data writing or programming is a high voltage pulse of about 25 V, for example. Upon the completion of the data writing into the memory cell array, the EPROM is used as a normal ROM. For reading out data from the EPROM, the program signal VP is not used. Accordingly, at the time of data read, the terminal 10 may be used as a terminal for handling a signal other than the address input and the data input signal, for example, an output enable signal $\overline{OE}$.

As described above, when the terminal 10 is used for both the signals VP and $\overline{OE}$, and the signal VP is handled, a relatively large programming current flows into the terminal 10. The programming current flowing through the EPROM is generally in a range from several tens mA to several handreds mA. On the other hand, when the signal $\overline{OE}$ is handled, a signal current Is flowing into the terminal 10 is extremely small. The current Is is usually within ±10 μA. When the terminal 10 is used as a signal terminal for a signal such as $\overline{OE}$, a large current Is decreases the fanout of the remaining circuits connected to the terminal 10. It is for this reason that, when the terminal 10 is used as a signal terminal, the current Is must be set to be small as possible. As describe above, when the terminal circuit according to the invention is applied to the control logic 100 of the EPROM as shown in FIG. 2 or the buffer 102, the terminal 10 may handle the signal VP going with a large current and the signal $\overline{OE}$ with little current.

Figure 3:
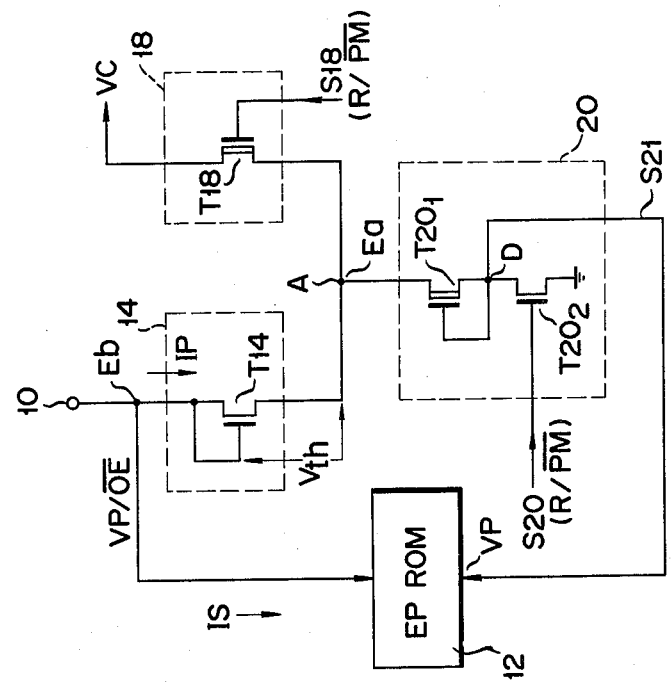
FIG. 3 is a circuit diagram of the detail of the block diagram shown in FIG. 1.

In such a case, the block construction shown in FIG. 1 may be embodied by a circuit shown in FIG. 3, for example. Assume now that a ground potential or a substrate potential is zero and the potential Eb of the terminal 10 and the first potential VC are a positive potential. The terminal 10 is connected to a VP/$\overline{OE}$ input terminal of an EPROM 12 corresponding to the optional circuit 12 and also to the drain and gate terminals of a MOS transistor corresponding to the unidirectional conductor 14. The transistor T14 is of the N-channel enhancement type and the source of the transistor T14 is coupled with the coupling node A.

The coupling node A is connected to the potential VC, through the source-drain path of a MOS transistor T18 corresponding to the first circuit 18. The transistor T18 is of the N-channel depletion type, in this example. The ON/OFF of the transistor T18 depends on a logical level of a signal S18 applied to the gate of the transistor. The coupling node A is further connected to the drain of an N-channel depletion type MOS transistor $T20_1$. The gate and source of the transistor $T20_1$ is connected to a substrate, by way of the drain-source path of an N-channel enhancement type MOS transistor $T20_2$. The transistors $T20_1$ and $T20_2$ cooperatively form the second circuit 20. The transistor $T20_1$ serves as a load of the transistor $T20_2$. The ON/OFF of the transistor $T20_2$ depends on a logical level of a signal S20 applied to the gate thereof. A signal S21 corresponding to the ON/OFF of the transistor $T20_2$ is derived from the drain end of the transistor $T20_2$ or an output node D. The signal S21 is applied as a programming instruction to the VP input terminal of the EPROM 12.

FIGS. 4A to 4F show timing charts useful in explaining the circuit operation of the circuit shown in FIG. 3. Before time t12, the EPROM 12 is used for data read and, after time t12, data is programmed in the EPROM 12. Assume that, before t10, the signal S20 is logical "0" and the signal S18 is logical "1". At this time, the transistor $T20_2$ is OFF and the transistor T18 is ON, and that the gate threshold voltage of the transistor T14 is Vth and the potential difference Eb-Ea is below Vth, i.e. $Eb < Ea + Vth$ ... (1). For example, when $0 \leq Eb \leq VC$ and $Ea = VC$, the equation (1) is satisfied. At this time, the transistor T14 is OFF. Before time t10, the transistors T14 and $T20_2$ are OFF while the transistor T18 is ON, the potential Ea is VC, i.e. Ea=VC. If the VP input impedance of the EPROM 12 is infinite, when Ea=VC, the potential of the signal S21 also is VC (=logical "1"). When the potentials Eb and Ea (=VC) are too low for a programming input to the EPROM 12, no programming is performed, for example, when VC=5 V.

When the signal S20 is logical "1" for a period from t10 to t12, the transistor $T20_2$ is ON. Subsequently, the signal S21 becomes zero level and the potential Ea falls from VC to VC−ΔV. The voltage drop ΔV is caused by a drain-source conduction resistance of the transistor T18. Even if the potential Ea falls the VC−ΔV, it is possible to satisfy the equation (1). That is, the following relation may be satisfied $$Eb < VC - \Delta V + Vth \quad (2)$$

This is equivalent to the satisfaction of the following relation when Eb=VC $$Vth > \Delta V \quad (3)$$

The relation (3) may be realized by properly selecting pattern sizes of the transistors T14, T18, $T20_1$ and $T20_2$ in a single IC chip. By properly selecting the pattern sizes, the potential Ea of the node A may be kept at a substantially constant (≃VC) when the signal S18 is logical "1" (≃VC), regardless of the logic level of the signal S20.

During a period t10 to t12, when the signal S21 is logical "0", the EPROM 12 is ready for read operation. That is, when the output enable signal $\overline{OE}$ of logical "0" is applied from the terminal 10 to the EPROM 12, the data is read out from a specific address in the EPROM 12. At this time, when the transistor T14 is OFF the drain current IP of the transistor T14 is zero. Accordingly, before time t12 the current (IP+IS) flowing through the terminal 10 is only the $\overline{OE}$ input terminal current IS of the EPROM 12. If the input impedance at the $\overline{OE}$ input terminal is infinite, the current IS is substantially zero. Before t12, only the read operation of data is performed and the terminal 10 is a signal terminal of a high input impedance (low input current) for handling the signal $\overline{OE}$.

After time t12, when the signals S20 and S18 are both logical "0", the transistors $T20_2$ and T18 are both OFF. At this time, the potential Eb is VP. If the OFF resistance of each of the transistors $T20_2$ and T18 and the VP input terminal resistance of the EPROM 12 are infinite, the voltage drop across the drain-source path of the transistor T14 is the mere gate threshold voltage Vth of the transistor T14. After t12, the potential Ea becomes VP−Vth, so that the potential of the signal S21 becomes VP−Vth. When the potential VP−Vth has a potential level satisfactory for the programming input to the EPROM, e.g. VP=25 V, a charge for programming is injected into a memory cell formed of, for example, a stacked-gate Avalanche injection type MOS (SAMOS), which memory cell is located at a given address of the EPROM 12.

After time t14, when the signal S20 becomes logical "1", the transistor $T20_2$ is turned on. Thereafter, the current IP flows into the transistor T14 and the potential Ea falls from VP Vth to VP−Vth−ΔV while at the same time the potential of the signal S21 falls from VP−Vth to zero. Following this, the charge injection or the programming to the memory cell (SAMOS) performed during the period t12 to t14, terminates. Incidentally, ΔV is a voltage drop caused by the conduction resistance of the transistor T14.

FIGS. 5A to 5C show how the threshold voltage Vth of the transistor T14 shown by the relation (1) changes with respect to a change of the source potential Ea to the substrate. FIG. 5B shows an Ea vs Vth curve when the potential difference Eb−Ea is constant. FIG. 5C shows an Eb vs IP when the source potential Ea is treated as a parameter. Those figures imply that the substantial threshold voltage Vth of the transistor T14 may freely be changed depending on the circuit design or the selection of the source potential Ea. The threshold voltage Vth may also be charged by injecting impurity material into the gate area of the transistor when it is manufactured. Accordingly, it is possible to design the IC circuit so as to satisfy the relation (1) or (2) when the terminal 10 is used as a signal terminal for the $\overline{OE}$ signal, as shown in FIG. 3.

Turning now to FIG. 6, there is shown an example where the optional circuit 12 includes an internal circuit of CPU etc. $12_2$ and the second circuit 20 includes a volatile memory device, e.g. a RAM $20_2$. In a single component microcomputer including a volatile memory device such as a RAM, the contents of the RAM and the other registers are destroyed when the power supply is shut off. When such a microcomputer is used, given data must be loaded into the RAM etc. every time the power supply is turned off and on. As a countermeasure, it is conceivable that a pad is additionally provided on the IC chip and the RAM is supplied with power from another power source. $TM_p$ 8048 manufactured by Toshiba Corporation or mode 8048 by Intel Corporation, for example, may be used as the microcomputer to which such a proposal is applicable. If so done, it is possible to continue the current supply in the RAM even if the power source of the CPU is turned off. Accordingly, only the RAM is always supplied with power, so that the contents of the RAM are never destroyed even if the CPU etc. is subjected to a power OFF.

The terminal 10 is used as a terminal to handle an interrupt input $\overline{INT}$, for example, when the power source VC of the CPU is ON, while, when the power source VC is OFF, it is used as a power supply terminal for supplying power to the RAM. The terminal 10 is connected to an extra pad 11 on an IC chip (not shown). The pad 11 is connected to the INT input terminal of an external circuit of CPU $12_2$, through an inverter $12_1$. The circuit 12 is supplied with power from the power source VC. The pad 11 is connected to the coupling node A, via the drain-source path of enhancement type MOS transistors $T14_1$ and $T14_2$. The transistors $T14_1$ and $T14_2$ are connected at the gates to the drains and the drain-source paths of the transistors are connected in series.

The coupling node A is connected to the power source VC by way of the source-drain path of an enhancement type MOS transistor T18. The gate of the transistor T18 is connected to the drain thereof. The node A is also coupled with the power input of the RAM $20_2$, through a depletion-type MOS transistor $T20_1$. The transistor $T20_1$ is connected at the gate to the source to form a load of the RAM $20_2$. The source of the transistor $T20_1$ is an output node D and the node D and/or the node A is used as a power supply circuit for the other volatile devices.

Assume now that the gate control voltages of the transistors $T14_1$, $T14_2$ and T18 are Vtha, Vthb and Vthc, and that $$Vtha + Vthb > Vthc \quad (4)$$

On this assumption, when the power source VC is ON, the circuit 12 is supplied with power from the VC, and the circuit 20 is supplied with power from the VC, through the transistor T18. At this time, the potential Ea at the node A is $$Ea = VC - Vthc \quad (5)$$

Accordingly, the transistors $T14_1$ and $T14_2$ are OFF even if the potential Eb of the terminal 10 is zero or VD (=VC). When VC=VD=5 V, Vtha+Vthb=2 V and Vthc=1 V, Ea=4 V from the equation (5). The transistors $T14_1$ and $T14_2$ are turned on when the following relation is satisfied $$Eb \geq Ea + Vtha + Vthb \quad (6)$$

In the above assumption, to turn on the transistors $T14_1$ and $T14_2$ when Ea=4 V, it is necessary that Eb≧4+2=6 V. However, the potential Eb is 5 V at its maximum and therefore the transistors $T14_1$ and $T14_2$ can not be turned on. Thus, when the transistors $T14_1$ and $T14_2$ or the unidirectional conductor 14 is OFF, the current IP is zero. Accordingly, when the power source VC is ON, the terminal 10 may be used as an interrupt input terminal to the circuit $12_2$.

Let us consider a case where the power source VC is turned off. In this case, it is assumed that only the terminal 10 is connected to the power source VD (=5 V). Upon turning off the power source VC, power supplied to the circuit $12_2$ and 18 is stopped, so that VC=0 V and the transistor T18 is OFF. At this time, the potential Ea at the node A falls to a value to satisfy the equation (6) or when the potential Ea falls from 4 V to 3 V, the transistors $T14_1$ and $T14_2$ are turned on. As a result, the potential Ea is clamped at 3 V. At this time, if the voltage drop across the drain-source path of the depletion type transistor $T20_1$ is 0.5 V, the power supply to the RAM $20_2$ is from the potential Ed of 2.5 V. The remaining volatile devices connected to the nodes A and D are also coupled with the potential Ea (3 V) or Ed (2.5 V). Accordingly, the contents of the volatile devices of the RAM $20_2$ are never destroyed when the power source VC is turned off. The power supply voltage to the RAM $20_2$ etc. from the power source VD is lower than that from the power source VC. Therefore, when the power source VC is OFF or in a stand-by state, no power is supplied to the circuit 12, so that the power consumption of the microcomputer becomes extremely small as a whole. Thus, when the power source VC is OFF, the terminal 10 may be used as a power supply input terminal by the power source VD.

In the example as mentioned above, the unidirectional conductor 14 is formed by a coupled of transistors $T14_1$ and $T14_2$ connected in series. However, this may be formed by a single MOS transistor T14. In this case, the gate threshold voltage Vthab of the transistor T14 must be larger than the gate threshold voltage Vthc of the transistor T18. If Vthab−Vthc≧1 V, the conductor 14 may be formed by a single enhancement-type MOS transistor.

Figure 7:
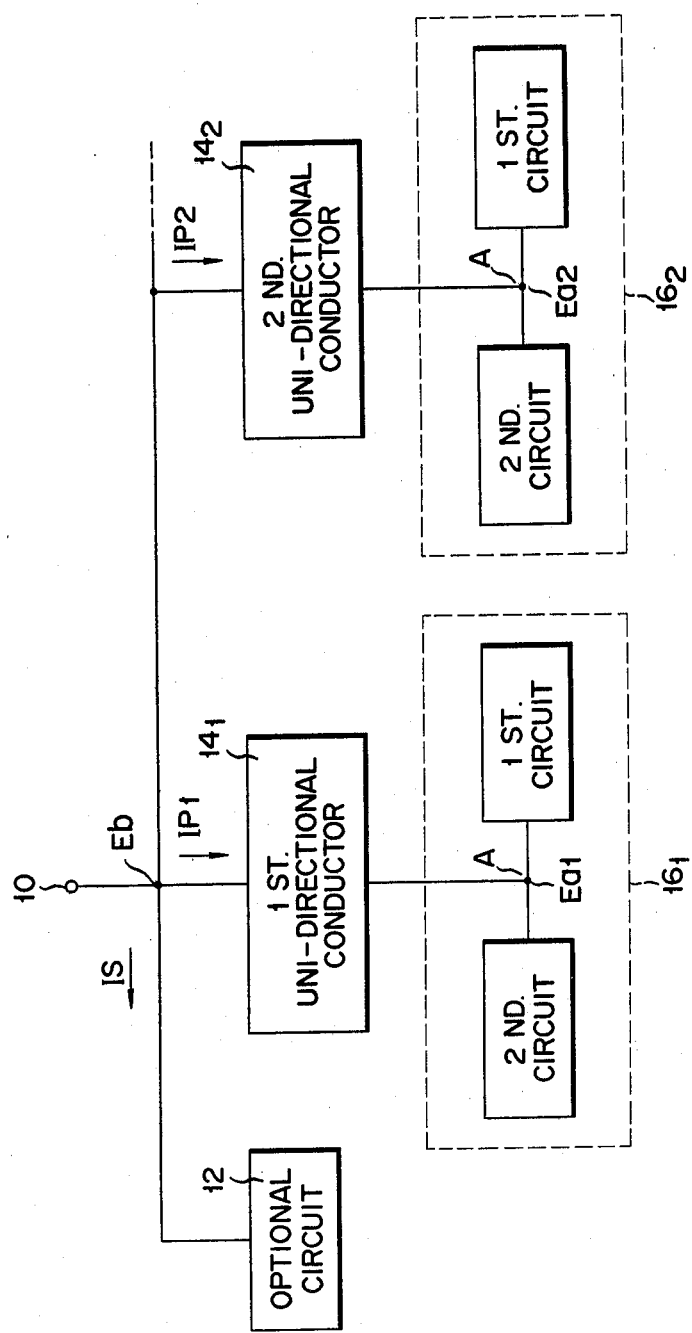
FIG. 7 shows a block diagram of a modification of FIG. 1 in which a single terminal 10 is connected to two or more unidirectional conductors $14_1, 14_2, \ldots$.

FIG. 7 shows a basic construction when a plurality of circuit blocks $16_1$, $16_2$, ... are coupled with one signal terminal 10. To the terminal 10 is connected an optional circuit 12. The terminal 10 is further connected to first and second circuit blocks $16_1$ and $16_2$, through first and second unidirectional conductors $14_1$ and $14_2$. When the conductors $14_1$ and $14_2$ are both in OFF state, the terminal 10 is used as a signal input terminal to the circuit 12. In an inactive state of the circuit 12, when only the first conductor $14_1$ enters in a conductive state, the terminal 10 serves as a signal input terminal to the circuit block $16_1$. In an inactive state of the circuit 12, when only the second conductor $14_2$ becomes conductive, the terminal 10 serves as a signal input terminal to the circuit block $16_2$. In this way, the single terminal 10 may be used for multiple inputs to a multifunction circuit.

Figure 8:
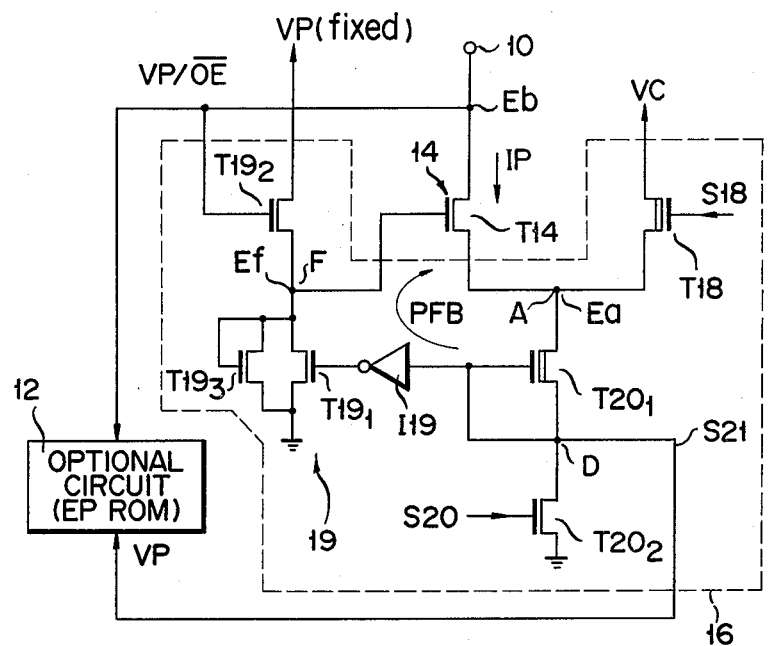
FIGS. 8 and 8A are circuit diagrams of modifications of FIG. 3.
Figure 8A:
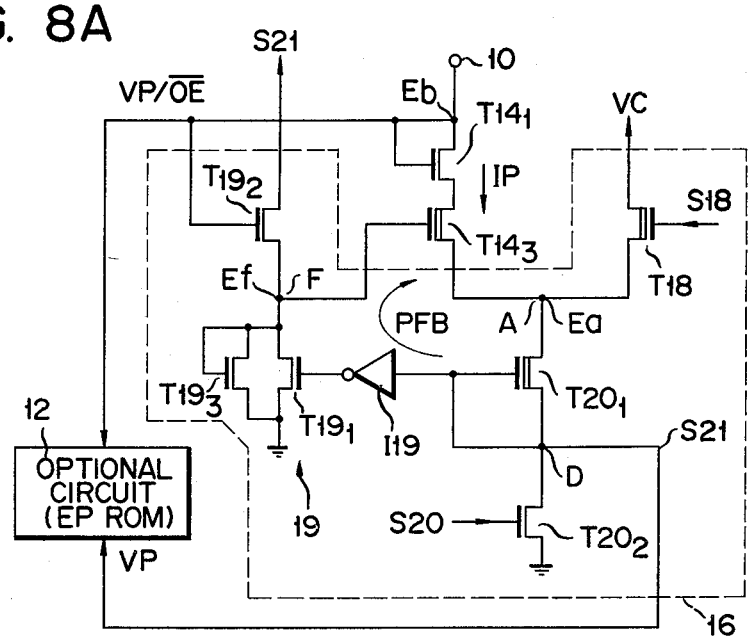

FIGS. 8 and 8A show a modification of the circuit shown in FIG. 3. In this example, the circuit block 16 includes a positive feedback (PFB) circuit 19. The output node D is connected through an inverter I19 to the gate of an N-channel MOS transistor $T19_1$. The transistor $T19_1$ is grounded at the source and connected at the drain to a feedback node F and to the source of an N-channel MOS transistor $T19_2$. The gate of the transistor $T19_2$ is connected to the terminal 10 and the drain thereof is connected to the fixed potential VP (FIG. 8) or the signal S21 (FIG. 8A). The node F is connected to the gate of the transistor T14 (FIG. 8) or the transistor $T14_3$ (FIG. 8A). The same node is grounded through the drain-source circuit of an N-channel enhancement type MOS transistor $T19_3$ of which the gate is connected to the drain thereof.

FIGS. 9A to 9G are a set of timing charts for illustrating the operation of the circuit shown in FIG. 8 or FIG. 8a. Before time t10, the signals S20 and S18 are logical "0" and logical "1", respectively. In this logical state, the transistors $T20_2$ is OFF while the transistor T18 is ON. The gate potential of the transistor T14 ($T14_3$) or the potential Ef of the node F change within an approximate range of 0 to 5 V in accordance with the signal $\overline{OE}$ inputted to the gate of the transistor $T19_2$. The transistor $T19_3$ discharges the potential near the node F potential when the transistor $T19_2$ is OFF with the logical change "1"→"0" of the signal $\overline{OE}$. Thus, the transistor $T19_3$ holds the node F potential near 5 V when the transistor T19₁ is OFF with the signal $\overline{OE}$ at logical "1" and the transistor T19₂ ON. For this, the ON-resistance of the transistor T19₃ is adequately larger than that of the transistor T19₂. If the relation (1) is satisfied, the transistor T14 (T14₁) is left OFF. Accordingly, the potential Ea is approximately VC ($\simeq$5 V) and the level of the signal S21 is approximately VC. As a result, the inverter I19 has an output of logical "0" and the transistor T19₁ is OFF.

During the period times t10 to t12, when the signal S20 becomes logical "1", the transistor T20₂ is turned on. Thereafter, the level of the signal S21 becomes zero and the potential Ea falls from VC to VC$-\Delta$V. When the signal S21 becomes zero level, the output of the inverter I19 becomes logical "1" and the transistor T19₁ is turned on. As a result, the potential Ef becomes zero level. Before time t12, the terminal 10 is used as a signal terminal for the signal $\overline{OE}$.

During a period t12 to t13, when the signal S20 becomes logical "0", and the potential Eb rises up to VP, the transistor T20₂ is turned off and the potential of the signal S21 rises. Thereafter, the output level of the inverter I19 falls while the potential Ef rises. The rise of the potential Ef continues until Ef$\simeq$VP. With rising of Ef, the potential Ea also rises. At this time, the rise of the potential Ea causes the potential at the node D to also rise, so that the nodes D$\rightarrow$F$\rightarrow$A$\rightarrow$D from a PFB loop. Incidently, the PFB is set up when a signal at the node A is fed back to the node F in phase. When the transistor T20₂ is turned off at time t12, the potential of the signal S21 and the potentials Ea and Ef rapidly reach the voltage VP through the action of the PFB. After the PFB operation starts or ends, i.e. at time t13, the signal S18 becomes logical "0". The transistor S18 is turned off when Ea>VC holds during a period of time from t12 to t13 and its OFF state is ensured by the logical "0" state of the signal S18 after time t13.

During a period from times t13 or t14, the potentials Eb, Ea, Ef and the signal S21 are VP. During this period, programming of the EPROM 13 is performed. When the first time programming is completed and the signal S20 becomes logical "1", the transistor T20₂ is turned on. Upon the turning-on of the transistor, the signal S21 falls toward zero level and, with the falling, the potentials Ef and Ea also fall. The falling of the potential Ea starts slightly behind that of the signal S21, so that an instantaneous pulse current IP frequently flows, although the current IP is small. Accordingly, the programming current of the overall EPROM 12 is also small and therefore a current capacity of a PROM writer may be small.

The circuit construction shown in FIG. 8 or FIG. 8A is applicable for, for example, a one-chip IC circuit including CPU, RAM, registers, etc., as shown in FIG. 6.

Figure 10L:
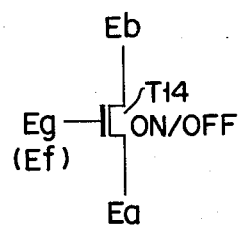
FIGS. 10A to 10Q show modifications of the unidirectional conductor 14 which are applicable for the circuit of FIG. 3, 6 or 8.
Figure 10M:
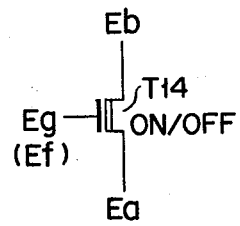
Figure 10N:
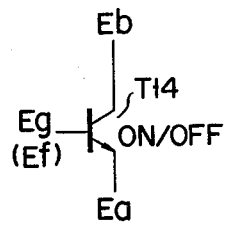
Figure 10O:
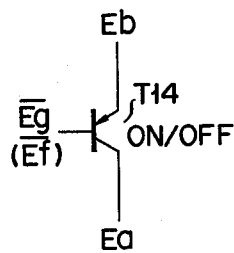
Figure 10P:
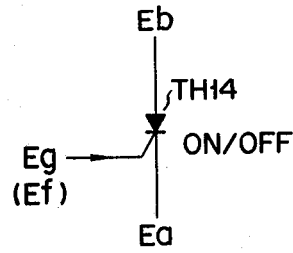
Figure 10Q:
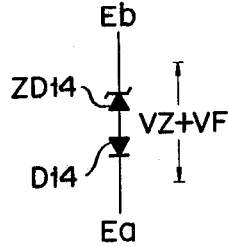

FIGS. 10A to 10Q show modifications of the unidirectional conductor 14 which are applicable for the circuit shown in FIG. 6 or 8. The examples shown in FIGS. 10A to 10I and FIG. 10Q are featured in that the ON and OFF states of the conductor 14 depend on the potential difference Eb$-$Ea. The feature of the FIGS. 10J to 10P resides in that the same states of the conductor 14 depend on the potential difference Eb$-$Ea and/or a potential Eg. The potential Eg may be the potential Ef of FIG. 8 or another ON/OFF signal or a fixed potential e.g. Ey or Ex to be given later.

The examples shown in FIGS. 10A and 10B are featured by the use of N-channel and p-channel enhancement-type MOS transistors T14. The substrate of the MOS transistor T14 is normally at a ground level or a power source level. By setting the substrate potential to a proper potential, threshold voltage Vth of the MOS transistor T14 may be changed properly.

Figure 11:
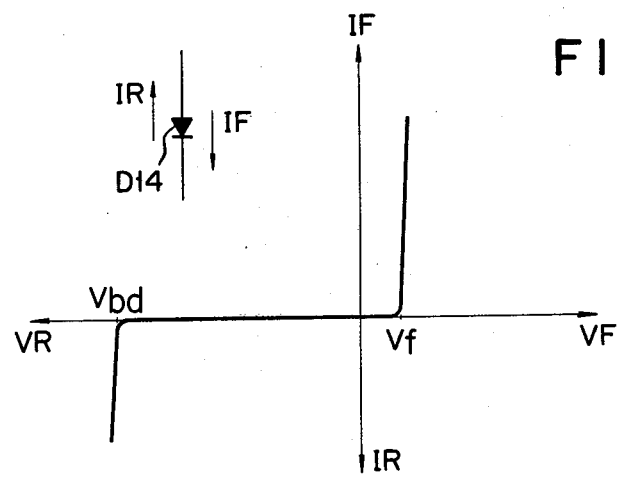
FIG. 11 is a graph showing a voltage-current characteristic of a general type P-N junction diode.

The example of FIG. 10C is featured by the use of a single P-N junction D14 and the example of FIG. 10D has a feature of the use of a plurality of P-N junctions D14$_n$. FIG. 11 shows a voltage vs current characteristic of an usual type P-N junction D14. As seen from FIG. 11, in the case of FIG. 10C, for example, the conductor 14 conducts when Eb$\geq$Ea+Vf. When Ea$-$Eb<Vbd and Eb<Ea+Vf where Vbd is a breakdown voltage of the P-N junction D14, the conductor 14 is cut off.

FIGS. 10E and 10C show examples where the diode P-N junction is replaced by the base-emitter P-N junction of the bipolar transistor T14. FIG. 10F shows an example in which a P-N junction (diode) D14 is inserted between the collector and base of the transistor T14 shown in FIG. 10E. Although not shown, the P-N junction D14 may be connected in series with the collector or emitter of the transistor T14.

FIGS. 10G and 10H show examples where two enhancement type MOS transistors T14₁ and T14₂ are connected in series. The circuit shown in FIG. 10G has already been described relating to FIG. 6. The example shown in FIG. 10H corresponds to that where the circuit shown in FIG. 10G is formed by using a CMOS.

FIG. 10J shows an example where a switching MOS transistor T14₃ for switching is connected in series to a MOS transistor T14₁. The source potential (or a prescribed node potential) Ec of the transistor T14₃ is determined in accordance with the gate potential Eg of the transistor T14₃. When the gate threshold voltage Vth₃ of the depletion type MOS transistor T14₃ is related by Eb$-$Vth₃=Eg, Ec=Eg$-$Vth₃ holds. From this relation, Eb may be larger than Ec, Eb>Ec, since the potential Ec is determined by the potential Eg. In other words, the transistor T14₁ is turned on and off in accordance with the magnitude of the potential difference Ec$-$Ea. Therefore, even when the potential Eb shown in FIG. 10J is higher than the potential Eb in FIG. 10A, the transistor T14₁ may be turned off.

FIG. 10K shows an example where an enhancement type MOS transistor T14₁ corresponding to the transistor T14 in FIG. 10A is connected in series with a depletion type MOS transistor T14₃. The potential Eg is so selected that a relation Eg$-$Vth₃<Ea holds. Here, the potential Eb is treated as a signal. The source spotential Ec of the transistor T14₁ is given $$Ec=Eg-Vth_3 \text{ (where } Eb\leq Ec+Vth_1)$$

or $$Ec=Eb-Vth_1 \text{ (where } Eb>Ec+Vth_1)$$

Under this condition, no current path continuing from the potential Ec side to the potential Ea side is formed.

The FIGS. 10D, 10F, 10G and 10H examples are useful for increasing the potential difference Eb$-$Ea when the conductor 14 is turned on. The example of FIG. 10I may adjust the potential difference Eb$-$Ea. The potentials Eb and Ea are applied to the source and drain of a P-channel enhancement-type MOS transistor T14₁, respectively. The drain of the transistor T14₁ is coupled with a potential Ea, through the series-connected drain-source circuits of N-channel MOS transistors T14$_4$ and T14$_5$. The gates of the transistors T14$_4$ and T14$_5$ are connected to the sources thereof, respectively, and the source of the transistor T14$_4$ is connected to the gate of the transistor T14$_1$. The transistors T14$_4$ and T14$_5$ are of the depletion type and have conduction resistances R4 and R5, respectively.

The potential Ey at the gate of the transistor T14$_1$ is given by $$Ey = Ea + \frac{R4}{R4 + R5}(Ex - Ea) \quad (7)$$

$$= \frac{R5}{R4 + R5} Ea + \frac{R4}{R4 + R5} Ex$$

When the gate threshold voltage of the transistor T14$_1$ is expressed by Vth$_1$, the transistor T14$_1$ is turned on when the following relation holds:

$$Ey \leq Eb + Vth_1 \quad (8)$$

From the relations (7) and (8), we have $$Eb \geq \frac{R5}{R4 + R5} Ea + \frac{R4}{R4 + R5} Ex - Vth_1 \quad (9)$$

The equation (9) implies that the condition for turning on of the transistor T14$_1$ may be changed by the resistances R4 and R5. When Ex>Ea, Ey>Ea, the potential difference Eb−Ea obtained when the transistor T14$_1$ is turned on increases. Conversely, when Ex<Ea, the potential difference Eb−Ea becomes small. The transistors T14$_4$ and T14$_5$ may be replaced by another circuit for forming a potential divider or a voltage divider.

FIGS. 10L to 10P show switch devices which are applicable mainly for the unidirectional conductor 14 shown in FIG. 8. FIG. 10L corresponds to the transistor T14 of FIG. 8. FIG. 10M is an example where the enhancement type MOS transistor T14 of FIG. 10L is replaced by the depletion type MOS transistor T14.

FIG. 10N shows an example in which an NPN type bipolar transistor T14 is used for the switch device. The example shown in FIG. 10O uses a PNP transistor T14 in place of the NPN transistor T14 in the circuit shown in FIG. 10N. In this case, the base input signal Eg (or Ef) of the transistor T14 is an inversion of that of FIG. 10N.

FIG. 10P shows an example using a thyristor TH14 for the switch device.

FIG. 10Q shows an example in which, by conecting in series a P-N junction diode D14 and a Zener diode ZD14, the potential difference Eb−Ea, which causes the conductor 14 to turn on, is increased.

Figure 12A:
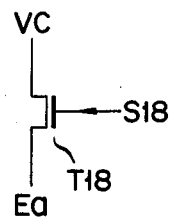
FIGS. 12A to 12I show modifications of the first circuit 18 which are applicable for the circuit of FIG. 3, 6 or 8.
Figure 12B:
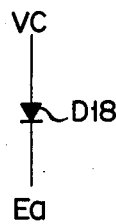
Figure 12C:
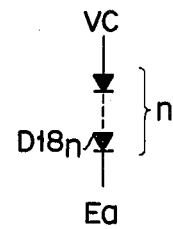
Figure 12D:
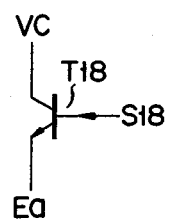
Figure 12E:
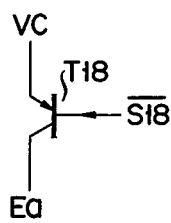
Figure 12F:

FIGS. 12A to 12I show modifications of the first circuit 18 which are applicable for the circuit of FIG. 3, 6 or 8. FIGS. 12A to 12E show circuits which are applicable for the unidirectional conductor 14. The examples shown in FIGS. 12F to 12I are unsuitable for the application thereof to the unidirectional conductor 14 but those are applicable for the first circuit 18. FIGS. 12F to 12I serve as the bidirectional conductors always or when an operation condition is satisfied. In the case of FIG. 12F, when a Zener voltage VZ of a zener diode ZD18 satisfies a relation VC−Ea≧VZ, current flows from the cathode to the anode. When a forward voltage drop VF satisfies a relation VC−Ea≦−VF, current flows from the anode to the cathode. When VZ≦VC−Ea≦−VF, the Zener diode ZD18 is turned off.

Figure 12G:
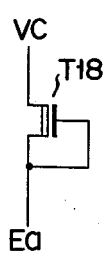
Figure 12H:
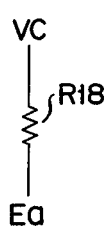

The example shown in FIG. 12G uses a depletion-type MOS transistor T18 for a load resistor of the second circuit 20. FIG. 12H shows an example in which a diffusion resistor R18 is used as the load resistor. The example of FIG. 12H is formed in a semiconductor substrate by diffusing N+ or P+ impurity thereinto. The examples shown in FIGS. 12G and 12H are perfect bidirectional conductors. For this, when the circuit shown in FIG. 12G or 12H is used, if the transistor T14 is turned on in FIG. 3, for example, the current IP flows to the potential VC side. In other words, the terminal 10 is coupled with the potential VC. When a circuit is so designed that such a coupling provides no problem, the first circuit 18 shown in FIG. 12G and 12H may be used.

Figure 12I:
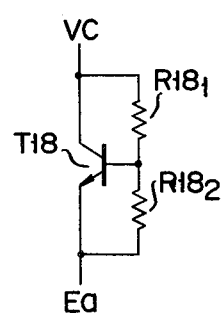

FIG. 12I shows an example having a function of the combination of the circuits FIGS. 12F and 12H. When VC<Ea, the circuit of FIG. 12I corresponds to a parallel circuit of the resistor R18 of FIG. 12H and a Zener dioe ZD18 of FIG. 12F. When the base-emitter threshold voltage Vbe of the transistor T18 satisfies a relation VC−Ea≧(1+R18$_1$/R18$_2$) Vbe, the transistor T18 is turned on. When the above relation is not satisfied, the transistor T18 is OFF. The examples shown in FIG. 12F or 12I are used when the potential difference VC−Ea is desired to be clamped at a fixed value.

Figure 13A:
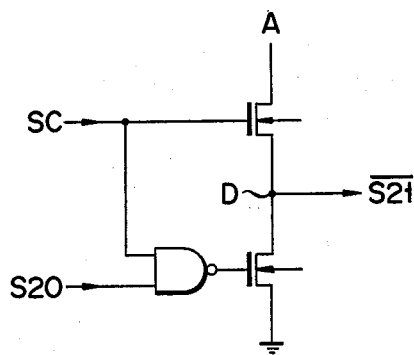
FIGS. 13A to 13D show modifications of the second circuit 20 which are applicable for the circuit of FIG. 3, 6 or 8.
Figure 13B:
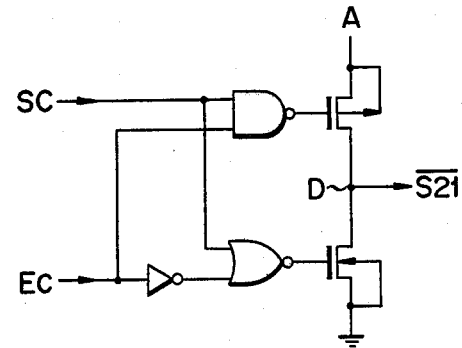
Figure 13C:
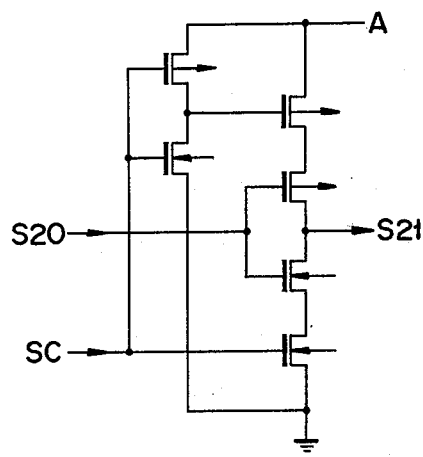
Figure 13D:
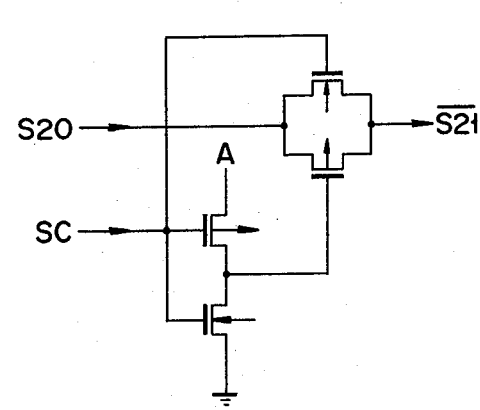

FIGS. 13A to 13D show modifications of the second circuit 20 which are applicable for the circuit shown in FIG. 3, 6 or 8. Those circuits are generally called a 3-state buffer or a tristate buffer. FIGS. 13A and 13B show inverted buffers and FIG. 13C is a non-inverted buffer. FIG. 13D is a transfer gate. When such a 3-state buffer is used, the coupling node A may be separated from the signal S20, S21 or $\overline{S21}$ and/or the ground circuit independently of the logical level of the signal S20.

FIGS. 14A to 14D show specific circuit diagrams when the terminal circuit according to the invention is applied for the EPROM shown in FIG. 2. FIGS. 14A to 14D show the substantial parts of the block diagram shown in FIG. 2. Those drawings are used to illustrate how the terminal circuit is connected to the EPROM. The circuit construction of the EPROM is not essential to the invention and is not the subject matter of the invention. Accordingly, the substantial parts thereof will be described without referring to the circuit of it.

Figure 14A:
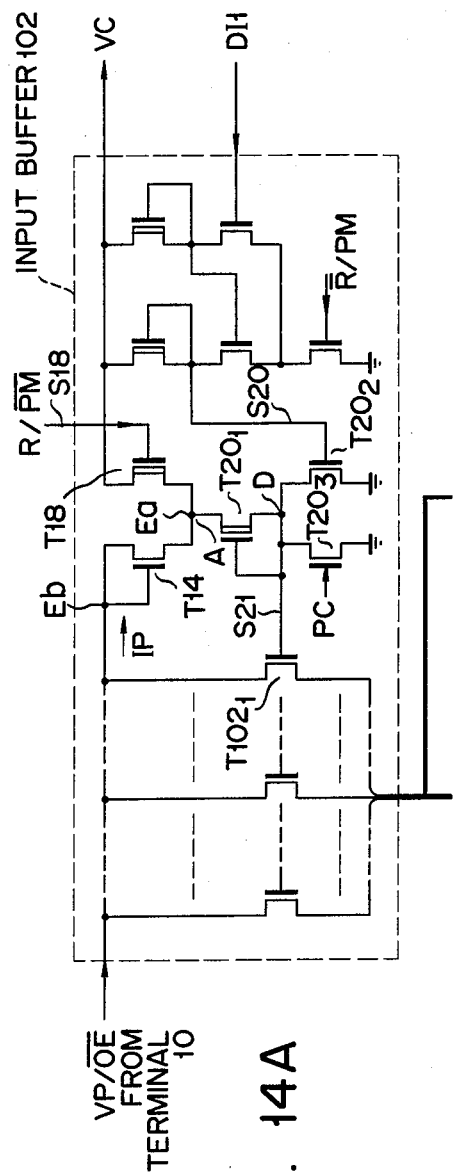
FIGS. 14A to 14D are circuit diagrams of the circuits when the terminal circuit according to the invention is applied for the EPROM shown in FIG. 2.
Figure 14C:
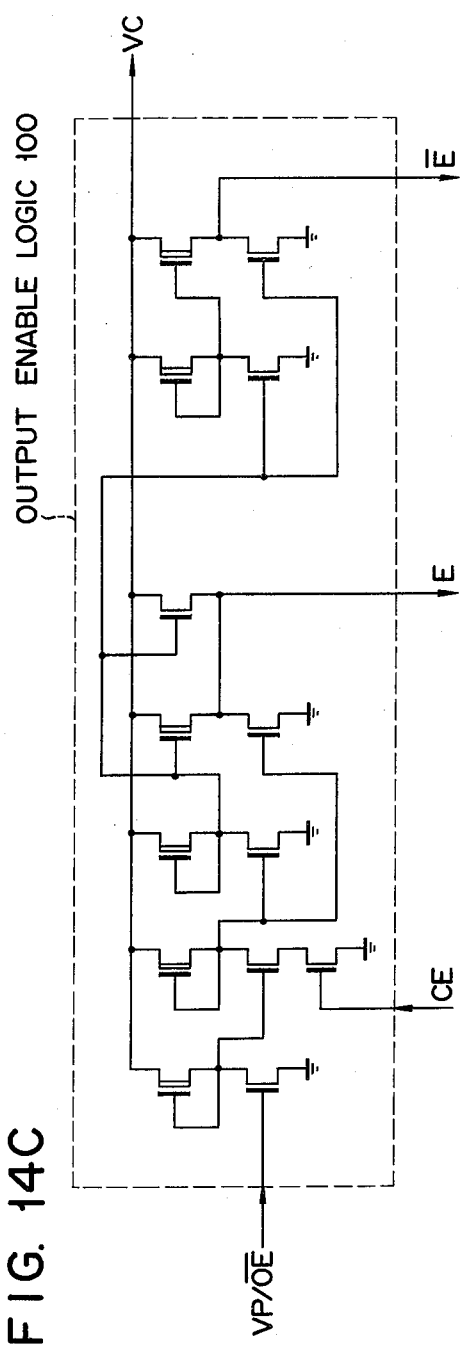
Figure 14B:
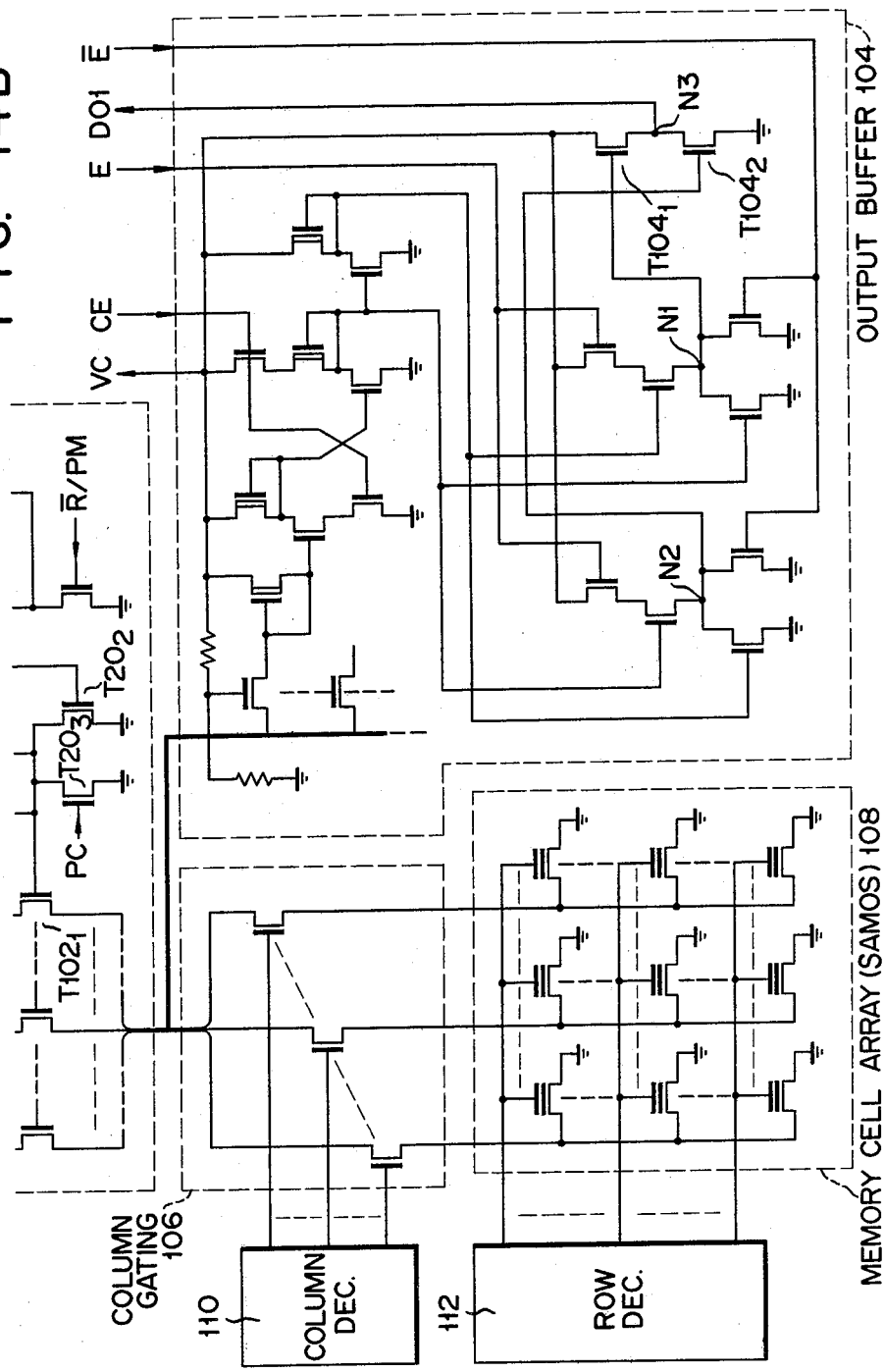

The terminal circuit is included in an input buffer 102 shown in FIG. 14A. The signal terminal 10 is connected to the VP/$\overline{OE}$ inputs of an output enable logic circuit 100 shown in FIG. 14C and the input buffer 102. A signal R/$\overline{PM}$ (S18) inputted to a transistor T18 of the terminal circuit switches between a read mode of the EPROM and a program mode. A signal R/PM is an inversion of the signal R/$\overline{PM}$ in its level. The EPROM is in the read mode when the R/$\overline{PM}$ is logical "1" and is in the program mode when it is logical "0".

When the R/$\overline{PM}$=logical "0", the program signal VP, e.g. 25 V, is applied to the terminal 10. The VP/$\overline{OE}$=25 V is detected as VP/$\overline{OE}$=logical "1" in the output enable logic 100. Upon the detection of the VP/$\overline{OE}$, the logic 100 produces signals E="0" and $\overline{E}$="1" and toward an output buffer 104. Then, nodes N1 and N2 within the buffer 104 become logical "0" and the N-channel MOS transistors T104$_1$ and T104$_2$ are cut off. The cutting off of the transistors causes a node N3, which for provides a data output DO1, to have a high impedance.

A signal PC inputted to an N-channel MOS transistor T20$_3$ of the terminal circuit is normally logical "1". After a given time (e.g. 1 μ second) lapses since programming input data DI1 is inputted, the signal PC is logical "0" only for a time, e.g. 50 m second, taken for the programming. When PC="0", the DI1 with a given logical level ("0" or "1") is applied as a signal S21 to the gate of an N-channel MOS transistor T102$_1$. The transistor T102$_1$ is turned on when the signal S21 is logical "1" and is turned off when it is logical "0". The logical level "1" of the signal S21 corresponds to the potential VC in the read mode and to the potential VP−Vth in the program mode, as shown in FIG. 4E.

When R/$\overline{PM}$="0", $\overline{R}$/PM="1" and PC="0", i.e. in the program mode, if DI1="0", a signal S20 inputted to an N-channel MOS transistor T20$_2$ of the terminal circuit is logical "0" and the transistor T20$_2$ is turned off. As a result, the signal S21 is logical "1" or the potential VP−Vth (≃23 V) and the potential VP is applied through the transistor T102$_1$ to a column gating 106 shown in FIG. 14B. The potential VP inputted to the column gating 106 is applied to a given cell in a memory cell array 108, so that data write or programming is performed. The address of the given cell is determined by a row decoder 112 and a column decoder 110.

In the read mode, R/$\overline{PM}$="1", $\overline{R}$/PM="0" and PC="1". As a result, the transistor T20$_3$ is turned on and the signal S21 is logical "0" regardless of the logical level of the data DI1, and the transistor T102$_1$ is turned off. In the read mode, the potential Ea at the coupling node A is in the vicinity of VC (see FIG. 4D). Accordingly, when the potential Eb of the VP/$\overline{OE}$ inputted to the terminal 10 satisfies the relation (1), an N-channel MOS transistor T14 is in OFF state and the drain current IP of the transistor T14 is zero. At this time, VP/$\overline{OE}$ serves as an output enable signal $\overline{OE}$. Accordingly, the logical states of the signal E and the signal $\overline{E}$ at the logic 100 are determined by a logical state of the signal VP/$\overline{OE}$. Depending on the logical state determined, it is decided whether the node N3 of the output buffer 104 is set to a high impedance or the buffer 104 produces output data DO1.

Figure 14D:
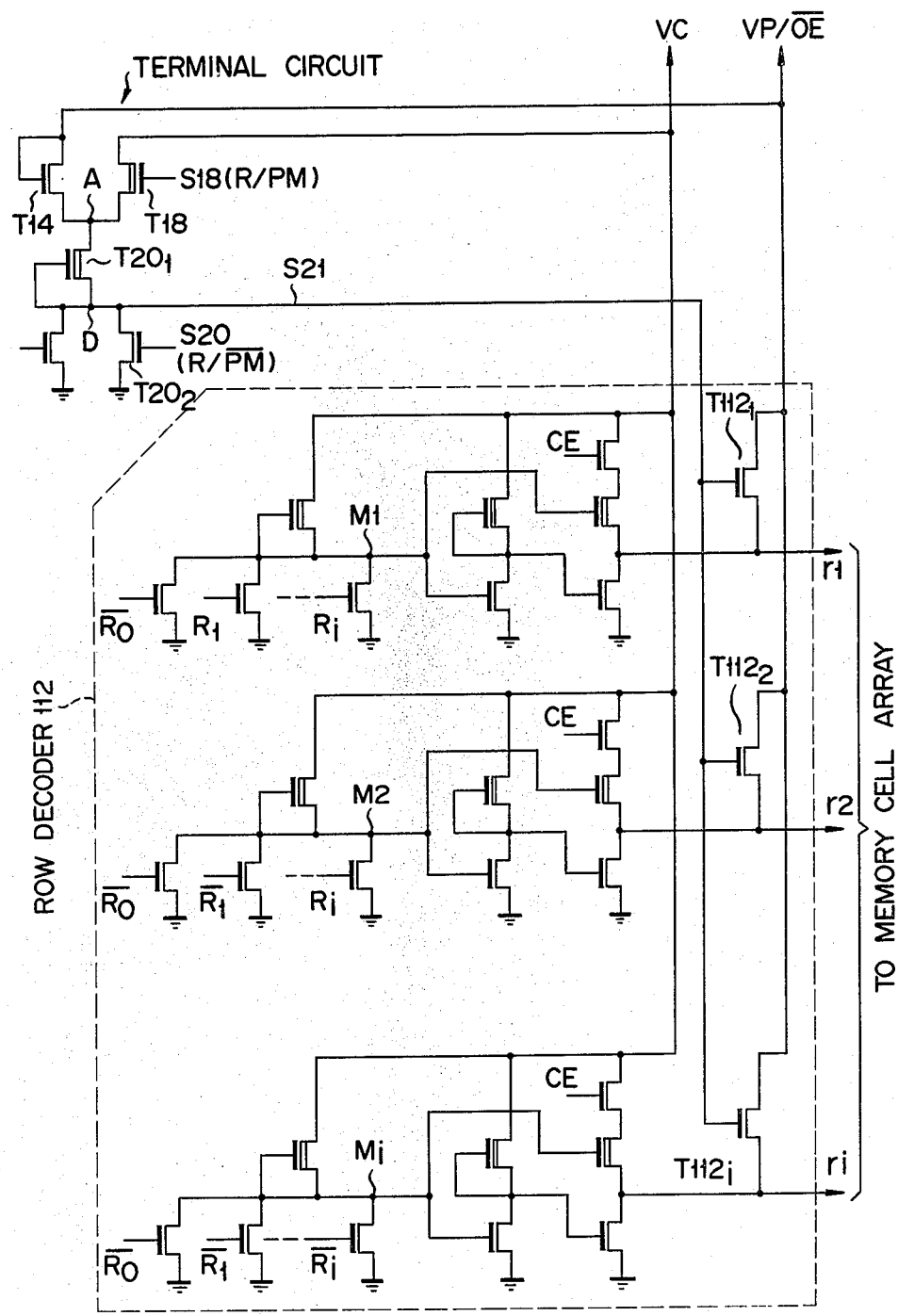

FIG. 14D shows the row decoder 112. In the program mode, R/$\overline{PM}$="0" and the signal S21 with the potential corresponding to VP−Vth or logical "1" appears at the node D of the terminal circuit. The potential VP−Vth is applied to the gates of N-channel MOS transistors T112$_1$ to T112$_i$ of the row decoder 112. The logical levels on row lines r$_1$ to r$_i$ continuous to the decoder 112 are determined by the logical levels at nodes M$_1$ to M$_i$. The logical levels at the nodes M$_1$ to M$_i$ are determined by a set of address inputs (R$_0$, R$_1$, . . . R$_i$). For example, when R$_0$="1", R$_1$ . . . R$_i$="0", only the node M$_1$ becomes logical "1", so that the programming potential (≃VP) is applied to only the row line r$_1$, through the transistor R112$_1$. Similarly, when only the first column line of the array 108 becomes logical "1" (≃VP), data is loaded into the memory cell located at a crosspoint of the first column line and the row line r$_1$.

In the read mode, R/$\overline{PM}$="1" and the signal S21 is logical "0", so that the transistors T112$_1$ to T112$_i$ are all turned off. In this case, the row lines r$_1$ to r$_i$ have logical levels according to the set of the address inputs (R$_0$, R$_1$, . . . R$_i$). The logical "1" at this time is approximately VC level. Incidentally, the column decoder 110 may be exactly the same as that of the row decoder 112.

Figure 15:
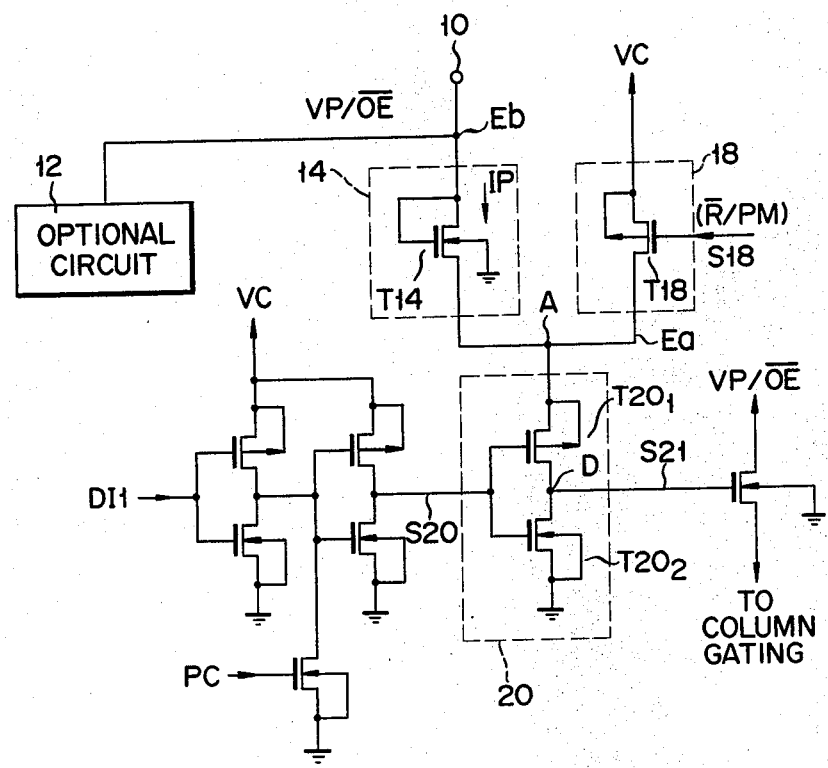
FIGS. 15 to 17 show modifications of the FIG. 3 circuit using CMOS transistors.
Figures 16, 17:
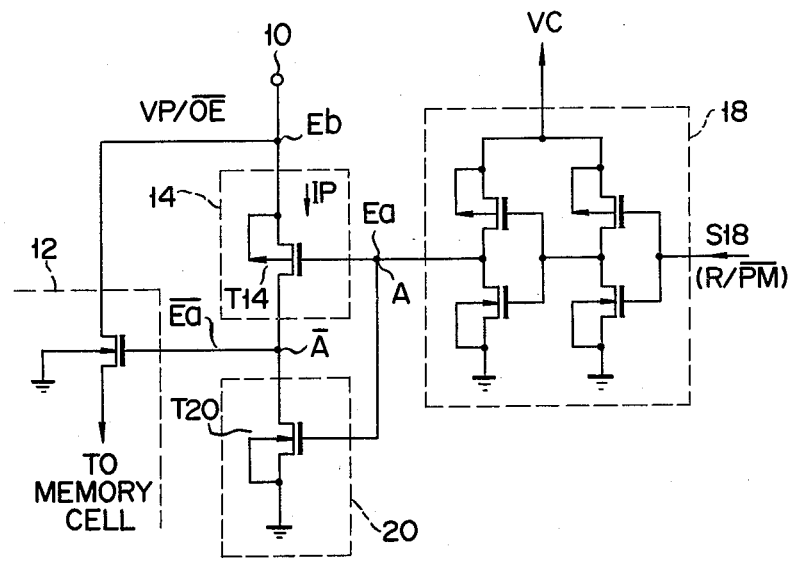

FIGS. 15 to 17 show circuit diagrams in which the circuit shown in FIG. 1 is formed in terms of a CMOS transistor circuit using a P-substrate. It may of course be formed by the CMOS transistor circuit with an N-substrate. In the case of FIG. 15, an N-channel enhancement-type MOS transistor T14 forms the unidirectional conductor 14. The first circuit 18 is formed by a P-channel enhancement-type MOS transistor T18 and the second circuit 20 by a CMOS inverter.

In the case of use of the CMOS inverter 20, when a load impedance coupled with the output node D is sufficiently large, the current flowing from the coupling node A into a power supply circuit of the inverter 20 is nearly zero. Accordingly, when the FIG. 3 circuit is replaced by the FIG. 15 circuit, the current IP at the time of programming may be extremely small.

In the circuit in FIG. 16, a P-channel enhancement-type MOS transistor T14 forms the unidirectional conductor 14. The first circuit 18 is constructed by a buffer circuit 18 connected in series to two CMOS inverters. The second circuit 20 is constructed by an N-channel enhancement-type MOS transistor T20. In FIG. 16, two nodes each corresponding to the coupling node A shown in FIG. 1 are provided: one is a first coupling node A connecting the gate of the transistor T20 with the output terminal of the circuit 18; the other is a second coupling node $\overline{A}$ coupling the drain of the transistor T20 with the drain of the transistor T14. The unidirectional conductor 14 is turned off when the gate threshold voltage Vth of the transistor T14 satisfies the relation (1), i.e. Eb−Ea<|Vth|. Accordingly, with relation to an ON/OFF state of the conductor 14, the first coupling node A corresponds to the node A of FIG. 1. In the example shown in FIG. 16, the transistors T14 and T20 form a CMOS inverter and the current IP is nearly zero regardless of the logical level of the node A.

In FIG. 17, the unidirectional conductor 14 is formed by a series circuit having a P-channel enhancement-type MOS transistor T14 and a P-N junction diode D14. The first circuit 18 is formed by a CMOS buffer circuit like that of FIG. 16. The second circuit 20 is formed by a CMOS inverter 20 including a P-N junction diode D20 related to the drain circuit thereof in series fashion. When the input signal S18 (R/$\overline{PM}$) of the circuit 18 is logical "1", Ea=Eb=VC and the transistor T14 is OFF. At this time, the logical level "1" or "0" of the second coupling node $\overline{A}$ coupled with the cathode of the diode D14 is determined by logical level "0" or "1" of a signal S21 applied to the inverter 20. When the signal S18 is logical "0" Eb=VP, the transistor T14 is turned on. At this time, the logical level "1" or "0" at the node $\overline{A}$ becomes VP or zero. The diode D14 prevents a reverse current $\overline{IP}$ from flowing from the node A to the terminal 10 when the logical levels at the nodes A and $\overline{A}$ are both logical "1". The diode D20 prevents part of the current IP from flowing from the terminal 10 to the VC, through the transistor T20$_2$ when Eb=VP, S21=logic "0" of the trasistor T20$_2$=ON. That is, the diodes D14 and D20 are used as reverse current stoppers.

FIGS. 18A to 18E show a series of semiconductor cross sectional views for illustrating a manufacturing process of the transistor T14 shown in FIG. 3. The manufacturing process to be given is correspondingly applied to the manufacture of other transistors T18, T20$_1$ and T20$_2$.

Figure 18A:
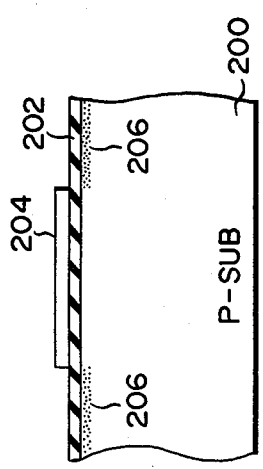
FIGS. 18A to 18E are semiconductor cross sectional views for illustrating a manufacturing process of the MOS transistor T14 shown in FIG. 3.

In FIG. 18A, an SiO$_2$ layer 202 is grown on a P type substrate 200. An Si$_3$N$_4$ layer 204 is layered at a given region on the layer 202. On this location, a gate, a drain and a source of the transistor T14 is formed later. Boron 206 for channel cutting is implanted into the field region on the periphery of the layer 204 by the ion implantation.

Figure 18B:
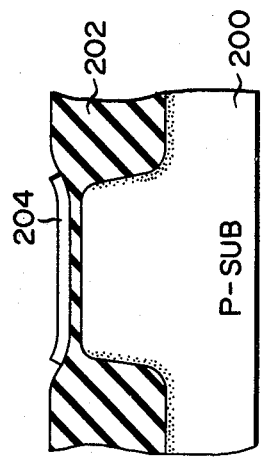

In a step of FIG. 18B, the layer 202 of the field region is thickened by the thermal oxidation. After the thickening step of the layer 202 ends, the layer 204 is removed.

Figure 18C:
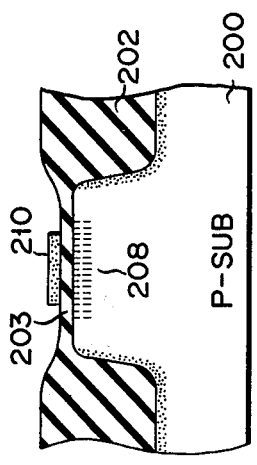

In a step of FIG. 18C, a gate oxide film 203 is formed on the channel region within the given region after the removal of the layer 204.

Then, given impurity 208 is implanted thereinto by the ion implantation, in order to control the gate threshold voltage Vth of the transistor T14. The given impurity 208 may be boron (IIIA group element), for example, for the enhancement type and phosphorus or arsenic (VA group element), for example, for the depletion type. After the implantation of the impurity 208 is completed, polysilicon (or molybdenum) 210 is layered as a gate electrode.

Figure 18D:
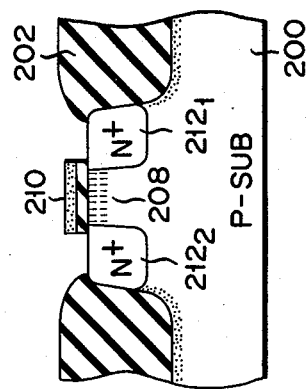

In a step of FIG. 18D, the oxide layer 203 is removed from the region where the drain, the source and an N+ wiring layer are formed. Then, N+ impurity is diffused through the oxide-layer removed region thereby to form N+ regions 212$_1$ and 212$_2$.

Figure 18E:
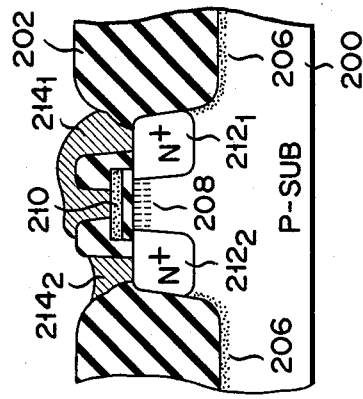

In a final step of FIG. 18E, an SiO$_2$ layer 202 is further formed so as to cover the N+ regions 212$_1$ and 212$_2$, and the polysilicon 210. Then, parts of the SiO$_2$ layer 202 on the polysilicon 210 and the N+ regions 212$_1$ and 212$_2$ are opened, and through the opening metal-wiring layers 214$_1$ and 214$_2$ made of aluminum, for example, are formed.

FIG. 19A shows an IC cross sectional view of the FIG. 3 circuit manufactured through the process illustrated in FIGS. 18A to 18E. FIG. 19B is an equivalent circuit of the structure shown in FIG. 19A.

Figures 20A, 20B:
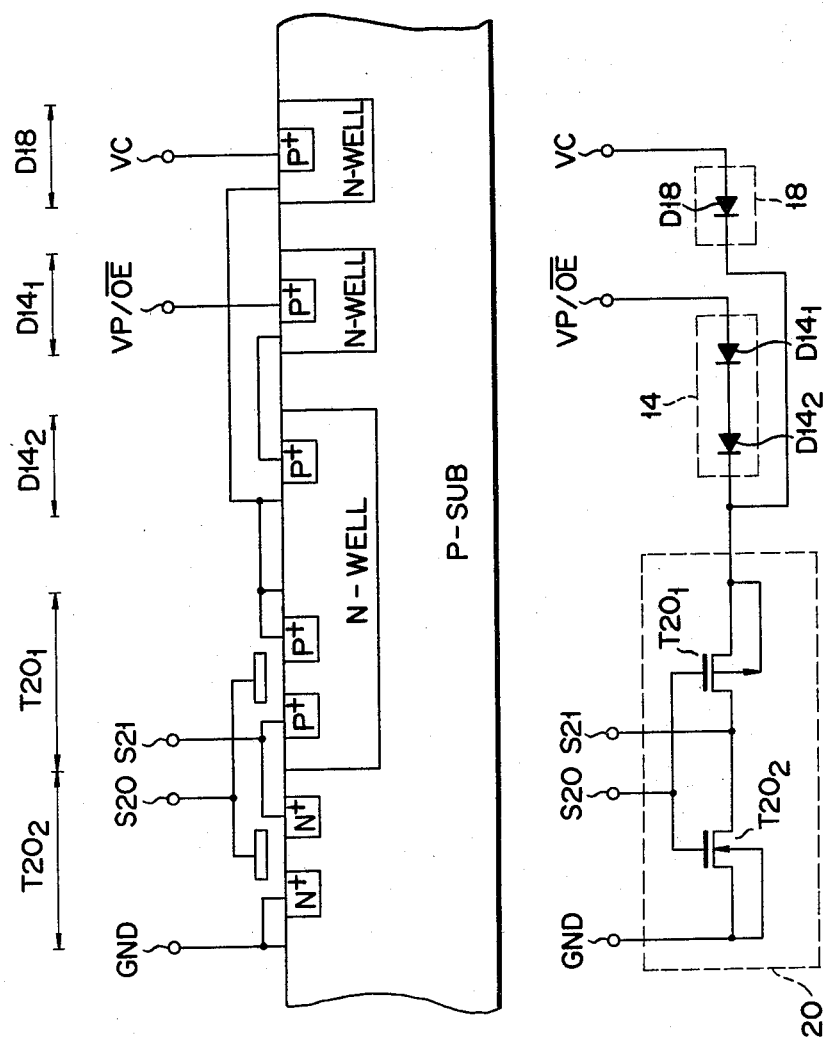
FIG. 20A is an IC cross sectional view of a modification of FIG. 19A.
FIG. 20B is an equivalent circuit of the structure of FIG. 20A.

FIG. 20A is a modification of the structure of FIG. 19A, and FIG. 20B is an equivalent circuit of the structure of FIG. 20A. The example shown in FIGS. 20A and 20B corresponds to an example which is the combination of the circuits of FIG. 10D and FIG. 12B, and the second circuit or the CMOS inverter 20 of FIG. 15. The structure of FIG. 20A may be formed by a conventional CMOS manufacturing process. The circuits shown in FIGS. 3, 6, 8, 10A to 10Q, 12A to 12I, 13A to 13D, 14A to 14D, and 15 to 17 may be integrated by the process referred to relating to FIGS. 18A to 18E or another proper conventional process.

FIGS. 21A to 21B structurally illustrate the MOS transistor used in the circuit shown in FIG. 19A of which the IC structure is for preventing photocurrent. In the IC device which is exposed to light rays through a transparent cover, such as EPROM to erase the stored contents by ultraviolet rays, light rays are incident upon the P-N junction of the IC exteriorly. The P-N junction illuminated by exterior light rays produces photocurrent. Accordingly, when exterior light rays impinge upon the P-N junction formed by the P-substrate 200 and the N+ region 212$_2$, IP≠0, even when the transistor T14 is in the OFF state. As a result, in the case where another circuit (not shown) connecting to the terminal 10 of FIG. 3 is a device of which the maximum output current is small, such as an CMOS, the fan-out of the other circuits becomes substantially small. Further, when the current IP arising from the photocurrent is large, the normal operation in the other circuits are adversely affected.

In order to prevent the photocurrent, the example shown in FIG. 12A covers the P-N junctions formed between the substrate 200 and the region 212$_1$, and the substrate 200 and the region 212$_2$ with metal patterns 214$_1$ and 214$_2$ made of aluminum, for example. The covering patterns 214$_1$ and 214$_2$ substantially shade the light from the P-N junctions, so that the photocurrent is almost zero.

FIGS. 22A to 22C are a modification of the example shown in FIGS. 21A to 21C. In the example, the P-N junction between the N+ region 212$_1$ and the P-substrate 200 is covered with a second polysilicon 210$_2$.

The shading structure of FIGS. 21A to 21C or 22A to 22C may be applied for screening the P-N junction device other than the MOS transistor T14 from the light. Any other suitable screening structure may be employed for such a purpose if the screening structure can cover the P-N junction with light screening material.

Figure 23A:
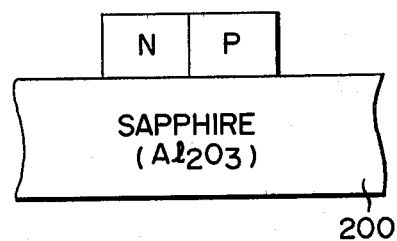
FIGS. 23A to 23D are structures of the P-N junction diode shown in FIGS. 10, 12 and 17.
Figure 23B:
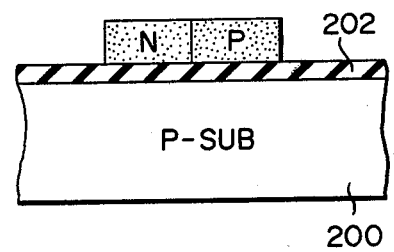
Figure 23C:
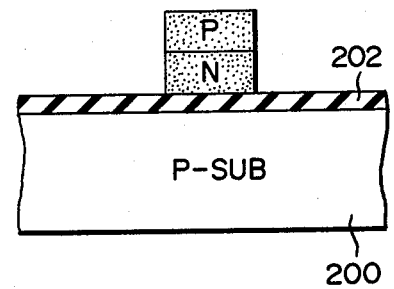
Figure 23D:
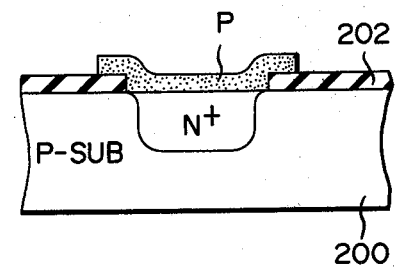

FIGS. 23A to 23D show some examples of the P-N junctions shown in FIGS. 10, 12 and 17. Those are other example than diodes D14, D14$_2$, and D18 shown in FIG. 20A. FIG. 23A shows an example where a P-N junction is arranged on a sapphire substrate 200 laterally. FIG. 23B shows an example in which a P-N junction of polysilicon on an SiO$_2$ layer 202 is formed on a P-substrate 200. In an example shown in FIG. 23C, a P-N junction of polysilicon is arranged on the layer 202 of FIG. 23B vertically. FIG. 23D shows an example where an N+ region is formed in a P-substrate 200 by diffusion and a P-polysilicon layer is formed thereon thereby to form a P-N junction.

Although specific constructions have been illustrated and described herein, it is not intended that the invention be limited to the elements and constructions disclosed. One skilled in the art will recognize that the particular elements or subconstructions may be used without departing from the scope and spirit of the invention.

What we claim is:

1. A multifunction terminal circuit, comprising:
    a. an optional circuit;
    b. a signal terminal connected to said optional circuit as an input terminal for said optional circuit;
    c. unidirectional conductor means also connected to said signal terminal for unidirectionally passing both signals and supply power applied to said signal terminal; and
    d. circuit means, having a coupling node coupled to said signal terminal through said unidirectional conductor means, for setting the conduction state of said unidirectional conductor means in accordance with a potential difference between said signal terminal and said coupling node;

wherein, when said unidirectional conductor means is rendered conductive, said signal terminal operates as an input terminal to said circuit means for either signals or supply power being applied to said signal terminal, and when said unidirectional conductor means is rendered non-conductive, said signal terminal operates as an input terminal to said optional circuit for signals being applied to said signal terminal.

2. A multifunction terminal circuit, comprising:
    a. an optional circuit;
    b. a signal terminal connected to an input of said optional circuit;

c. unidirectional conductor means having an input connected to said signal terminal and having a gate; and d. circuit means for setting the conduction state of said unidirectional conductor means, said circuit means comprising:
   i. a coupling node coupled to said signal terminal through said unidirectional conductor means; and
   ii. a feedback node coupled to said gate of said unidirectional conductor means;

wherein, said conduction state of said unidirectional conductor means is set in accordance with a potential difference between said coupling node and said feedback node; and wherein, potential variation at said gate of said unidirectional conductor means has the same phase as potential variation at said coupling node so that a circuit loop including the signal path of said coupling node and said feedback node forms a positive feedback loop.

3. A multifunctional terminal circuit, comprising:
   a. an optional circuit;
   b. a signal terminal connected to an input of said optional circuit;
   c. unidirectional conductor means also connected to said signal terminal; and
   d. circuit means, having a coupling node coupled to said signal terminal through said unidirectional conductor means, for setting the conduction state of said unidirectional conductor in accordance with a potential difference between said signal terminal and said coupling node, said circuit means comprising:
      i. a first circuit operable to connect said coupling node to a first potential; and
      ii. a second circuit connected to said coupling node;

wherein, when said first circuit operates to connect said coupling node to said first potential, said unidirectional conductor means is in a non-conducting state and said second circuit is activated with said first potential, and when said first circuit does not so connect said coupling node to said first potential, said unidirectional conductor means conducts in accordance with said potential difference between said signal terminal and said coupling node, and said second circuit is activated with a given potential which corresponds to the potential applied to said signal terminal.

4. A multifunction terminal circuit, according to claim 3, wherein said second circuit includes a volatile memory device which, when said unidirectional conductor means is in a non-conducting state, is power-supplied with said first potential and, when said unidirectional conductor means is in a conducting state, is power-supplied with a potential applied to said signal terminal, so that said volatile memory device is always activated by either said first potential or said potential applied to said signal terminal.

5. A multifunction terminal circuit, according to claim 1, 2, 3 or 4, wherein said optional circuit includes an electrically programmable read-only memory, and the signals applied to said signal terminal include a programming signal; and wherein, when said unidirectional conductor means is in a conducting state, upon reception of said programming signal said circuit means receives said programming signal through said unidirectional conductor means and provides a program instruction to said optional circuit in order to execute programming of said electrically programmable read-only memory.

6. A multifunctional terminal circuit, according to claim 1, 2, 3 or 4, wherein said unidirectional conductor means includes a P-N junction device connected between said signal terminal and said coupling node of said circuit means, and wherein the threshold voltage of said P-N junction determines said potential difference between said signal terminal and said coupling node at which said unidirectional conductor means is in a conducting state.

7. A multifunction terminal circuit, according to claim 1, 2, 3 or 4, wherein said unidirectional conductor means includes an enhancement-type MOS transistor having a gate and first and second electrodes, with said gate connected to said first electrode, said first and second electrodes connected between said signal terminal and said coupling node of said circuit means, and wherein the gate-threshold voltage of said MOS transistor determines said potential difference between said signal terminal and said coupling node at which said unidirectional conductor means is in a conducting state.

8. A multifunction terminal circuit, according to claim 3, wherein said second circuit includes a three-state buffer.

9. A multifunction terminal circuit, comprising:
   a. an electrically programmable read-only memory;
   b. a signal terminal connected to an input of said electrically programmable read-only memory;
   c. a first MOS transistor of enhancement-type having first and second ends, a gate, a drain, and a source, with said first end connected to said signal terminal, said gate coupled to said drain, and the drain-source path of said first MOS transistor connected between said first and second ends of said first MOS transistor;
   d. a second MOS transistor having first and second ends, a gate, a drain, and a source, with said first end thereof connected to a first potential, said second end thereof connected to said second end of said first MOS transistor, the drain-source path of said second MOS transistor being connected between said first and second ends of said second MOS transistor, and said second end of said second MOS transistor being defined as a coupling node;
   e. a third MOS transistor of depletion-type having first and second ends, a gate, a drain, and a source, with said first end thereof connected to said coupling node, said gate thereof coupled to said source thereof, the drain-source path of said third MOS transistor connected between said first and second ends of said third MOS transistor, and said second end of said third MOS transistor being defined as an output node; and
   f. a fourth MOS transistor having first and second ends, a gate, a drain, and a source, with said first end thereof connected to said output node, said second end thereof connected to a fixed potential, and the drain-source path of said fourth MOS transistor connected between said first and second ends of said fourth MOS transistor.

10. A multifunction terminal circuit, comprising:
    a. a signal circuit including a central progressing unit;
    b. a signal terminal connected to an input of said signal circuit;
    c. a first MOS transistor of enhancement-type having first and second ends, a gate, a source, and a drain, with said first end connected to said signal terminal, said gate coupled to said drain, and the drain-source path of said first MOS transistor connected between said first and second ends of said first MOS transistor;
d. a second MOS transistor of enhancement-type having first and second ends, a gate, a source, and a drain, with said first end thereof connected to a first potential, and said second end thereof connected to said second end of said first MOS transistor, said gate of said second MOS transistor coupled to said drain thereof, the drain-source path of said second MOS transistor connected between said first and second ends of said second MOS transistor, and said second end of said second MOS transistor having a power supply input and being defined as a coupling node; and
e. a volatile memory device connected at said power supply input to said coupling node.

11. A multifunction terminal circuit, comprising:
a. an optional circuit;
b. a signal terminal connected to an input of said optional circuit;
c. unidirectional conductor means also connected to said signal terminal; and
d. circuit means, having a coupling node coupled to said signal terminal through said unidirectional conductor means, for setting the conduction state of said unidirectional conductor means in accordance with a potential difference between said signal terminal and said coupling node;
wherein, said unidirectional conductor means includes:
  i. a MOS transistor having a gate and first and second electrodes, with said first and second electrodes being connected between said signal terminal and said coupling node of said circuit means; and
  ii. potential divider means for dividing a potential at said coupling node and providing a divided potential to said gate of said MOS transistor.

12. A multifunction terminal circuit, comprising:
a. an optional circuit;
b. a signal terminal connected to an input of said optional circuit;
c. a first conductivity enhancement-type first MOS transistor having a gate, a source electrode, and a drain electrode, with said drain electrode and said gate connected to said signal terminal, and with said source electrode thereof defined as a coupling node;
d. a second conductivity enhancement-type second MOS transistor having source and drain electrodes, with said source electrode thereof connected to a first potential and said drain electrode thereof connected to said source electrode of said first MOS transistor; and
e. a C-MOS inventer having a power supply path connected between said coupling node and ground;
wherein the conduction state of said first MOS transistor is determined in accordance with the potential difference between said signal terminal and said coupling node.

13. A multifunction terminal circuit, comprising:
a. an optional circuit;
b. a signal terminal connected to said optional circuit;
c. a first conductivity enhancement-type first MOS transistor having a gate, a source electrode, and a drain electrode, with said source electrode connected to said signal terminal;
d. a first circuit, an output end of which, being defined as a coupling node, is coupled with said gate of said first MOS transistor; and
e. a second conductivity enhancement-type second MOS transistor having a gate, a source electrode, and a drain electrode, with said source electrode thereof grounded, said gate thereof connected to said coupling node, and said drain electrode thereof connected to said drain electrode of said first MOS transistor;
wherein, said first and second MOS transistors form a C-MOS inverter having an input connected to said coupling node and an output delivered from said drain electrode of said second MOS transistor; and
wherein the conduction state of said first MOS transistor is determined in accordance with a potential difference between said signal terminal and said coupling node.

* * * * *

UNITED STATES PATENT AND TRADEMARK OFFICE
CERTIFICATE OF CORRECTION

PATENT NO. : 4,365,316
DATED : December 21, 1982
INVENTOR(S) : HIROSHI IWAHASHI et al.

It is certified that error appears in the above—identified patent and that said Letters Patent is hereby corrected as shown below:

Column 17, line 30, change "undirectional" to --unidirectional--.

Column 18, line 3, change "multifunctional" to --multifunction--.

Column 20, line 13, change "inventer" to --inverter--.

Signed and Sealed this

Twenty-eighth Day of June 1983

[SEAL]

Attest:

GERALD J. MOSSINGHOFF

Attesting Officer

Commissioner of Patents and Trademarks